US012718899B2

(12) United States Patent
Guo et al.

(10) Patent No.: US 12,718,899 B2
(45) Date of Patent: Aug. 25, 2026

(54) STATE DEPENDENT VERIFY VOLTAGE RAMPING TIME PERIODS FOR A PROGRAM-VERIFY OPERATION FOR PERFORMANCE GAIN

(71) Applicant: Sandisk Technologies, Inc., Milpitas, CA (US)

(72) Inventors: Jiacen Guo, Cupertino, CA (US); Xiang Yang, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 156 days.

(21) Appl. No.: 18/740,793

(22) Filed: Jun. 12, 2024

(65) Prior Publication Data

US 2025/0336454 A1 Oct. 30, 2025

Related U.S. Application Data

(63) Continuation-in-part of application No. 18/649,382, filed on Apr. 29, 2024, now abandoned.

(51) Int. Cl.
*G11C 16/06* (2006.01)
*G11C 16/34* (2006.01)

(52) U.S. Cl.
CPC ................................ *G11C 16/3459* (2013.01)

(58) Field of Classification Search
CPC ............ G11C 16/3459; G11C 11/5628; G11C 16/0483; G11C 16/08; G11C 16/10; G11C 16/32
USPC .................................................... 365/185.22
See application file for complete search history.

(56) References Cited

U.S. PATENT DOCUMENTS

| | | | | |
|---|---|---|---|---|
| 8,879,333 | B2 | 11/2014 | Costa et al. | |
| 9,195,587 | B2 | 11/2015 | Kochar et al. | |
| 9,437,318 | B2 | 9/2016 | Dong et al. | |
| 9,466,369 | B1 * | 10/2016 | Pang | G11C 16/08 |
| 11,410,739 | B1 | 8/2022 | Prakash et al. | |
| 11,848,059 | B2 * | 12/2023 | Guo | G11C 16/3445 |
| 12,046,314 | B2 * | 7/2024 | Zainuddin | G11C 29/12005 |
| 12,354,682 | B2 * | 7/2025 | Prakash | G11C 16/102 |

FOREIGN PATENT DOCUMENTS

| | | |
|---|---|---|
| KR | 20120098031 | 9/2012 |

* cited by examiner

*Primary Examiner* — Tha-O H Bui
(74) *Attorney, Agent, or Firm* — Dickinson Wright PLLC

(57) ABSTRACT

An apparatus includes a plurality of memory cells connected to word lines and bit lines and configured to retain a threshold voltage corresponding to one of a plurality of data states following a program operation; and a control circuit connected to the word lines and the bit lines. The control circuit is configured to use, during a setup clock of a loop of a plurality of loops of a program-verify operation, a first verify voltage ramping time period of a plurality of verify voltage ramping time periods based on a data state being verified during the loop, and use, during a setup clock of another loop of a plurality of loops of a program-verify operation, a second verify voltage ramping time period of the plurality of verify voltage ramping time periods based on a data state being verified during the other loop.

10 Claims, 19 Drawing Sheets

--Prior Art--

--Prior Art--

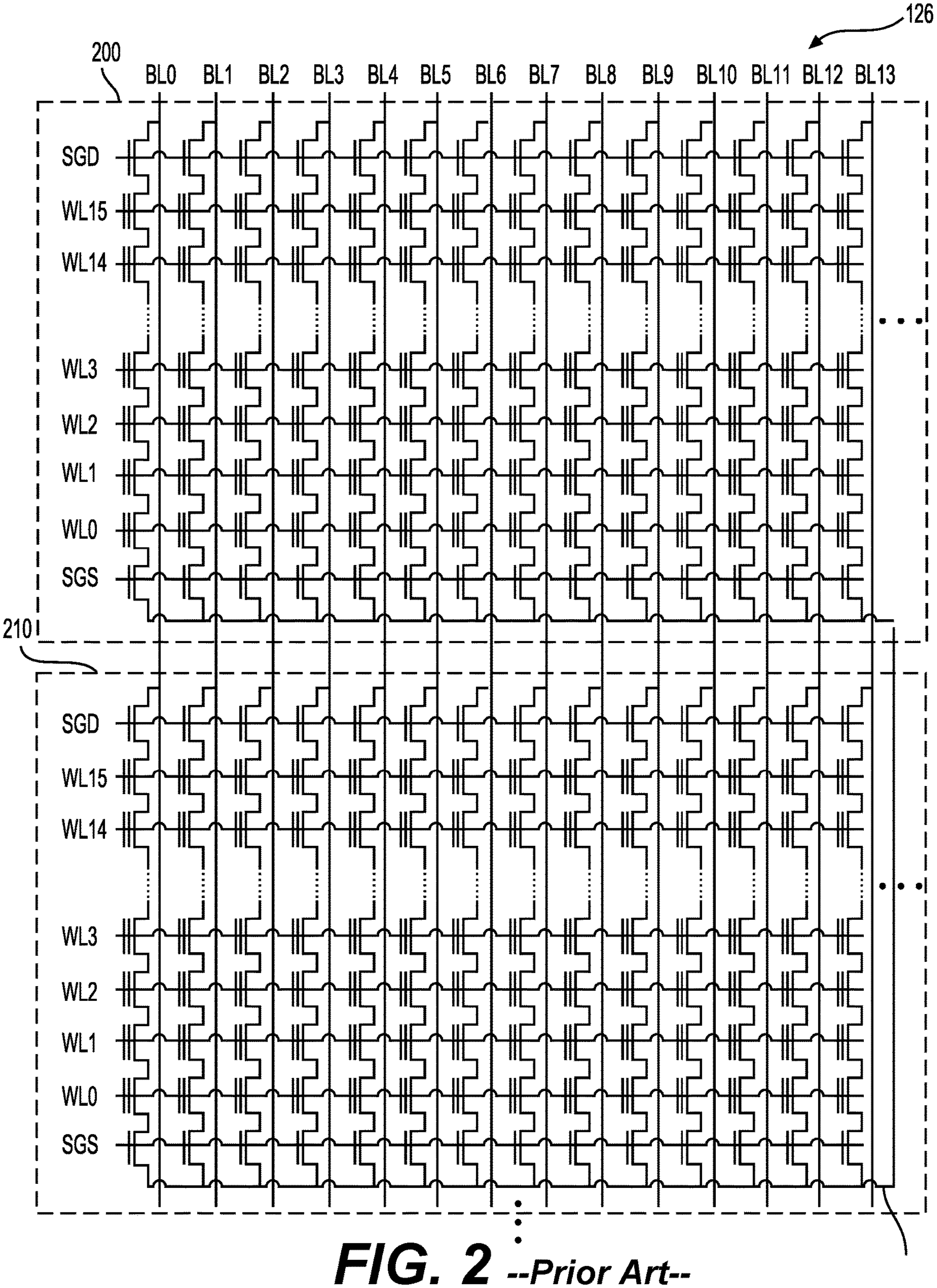
*FIG. 2* --Prior Art--

--Prior Art--

--Prior Art--

--Prior Art--

--Prior Art--

--Prior Art--

--Prior Art--

--Prior Art--

*--Prior Art--*

--Prior Art--

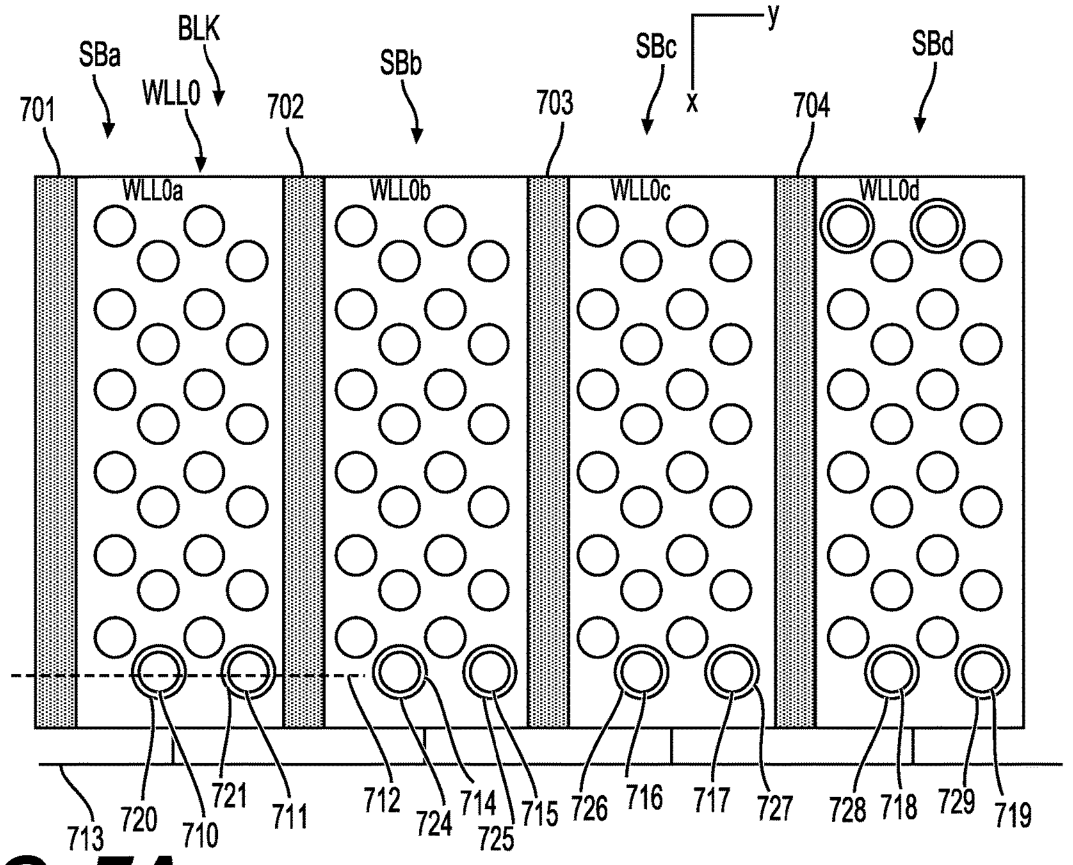
FIG. 7A --Prior Art--
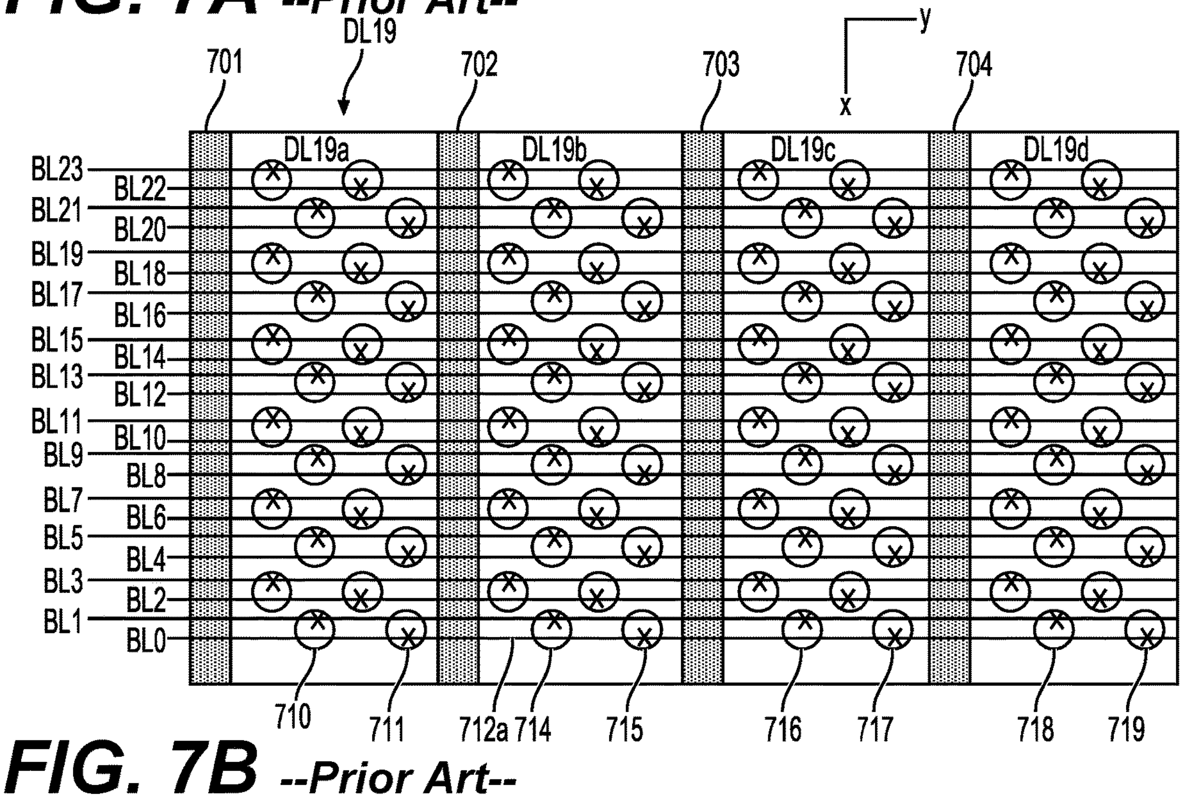
FIG. 7B --Prior Art--

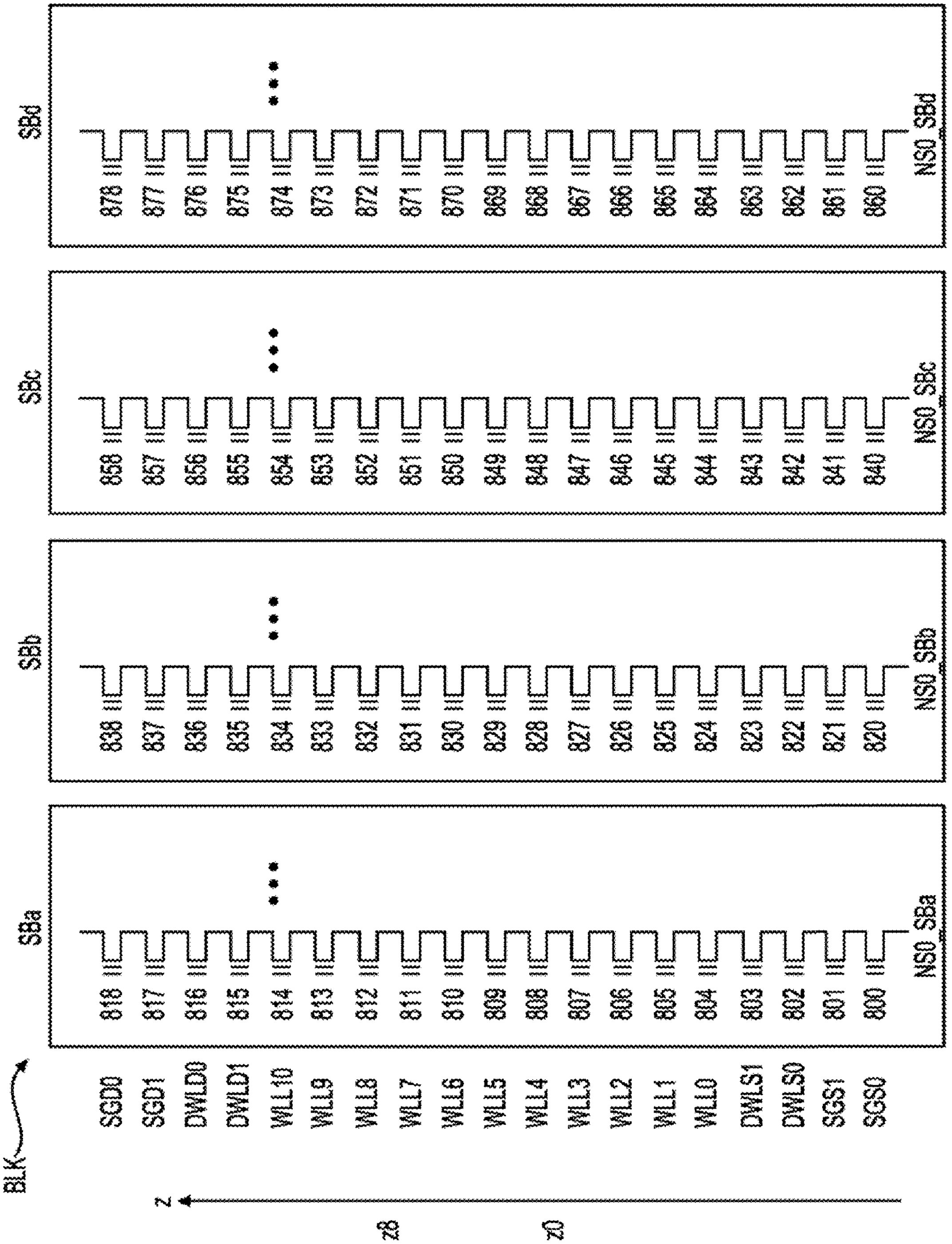
FIG. 8A --Prior Art--

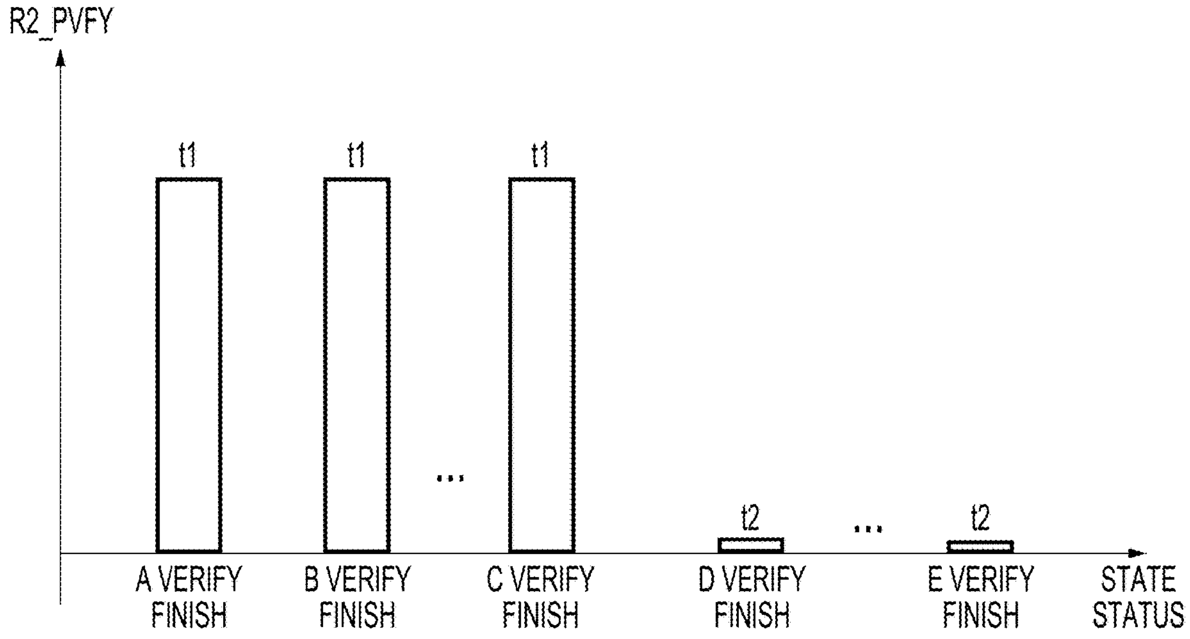

USE, DURING A SETUP CLOCK OF A LOOP OF A PLURALITY OF LOOPS OF A PROGRAM OPERATION, A FIRST VERIFY VOLTAGE RAMPING TIME PERIOD OF A PLURALITY OF VERIFY VOLTAGE RAMPING TIME PERIODS BASED ON A DATA STATE BEING VERIFIED DURING THE LOOP — 1702

USE, DURING A SETUP CLOCK OF ANOTHER LOOP OF A PLURALITY OF LOOPS OF A PROGRAM OPERATION, A SECOND VERIFY VOLTAGE RAMPING TIME PERIOD OF THE PLURALITY OF VERIFY VOLTAGE RAMPING TIME PERIODS BASED ON A DATA STATE BEING VERIFIED DURING THE OTHER LOOP — 1704

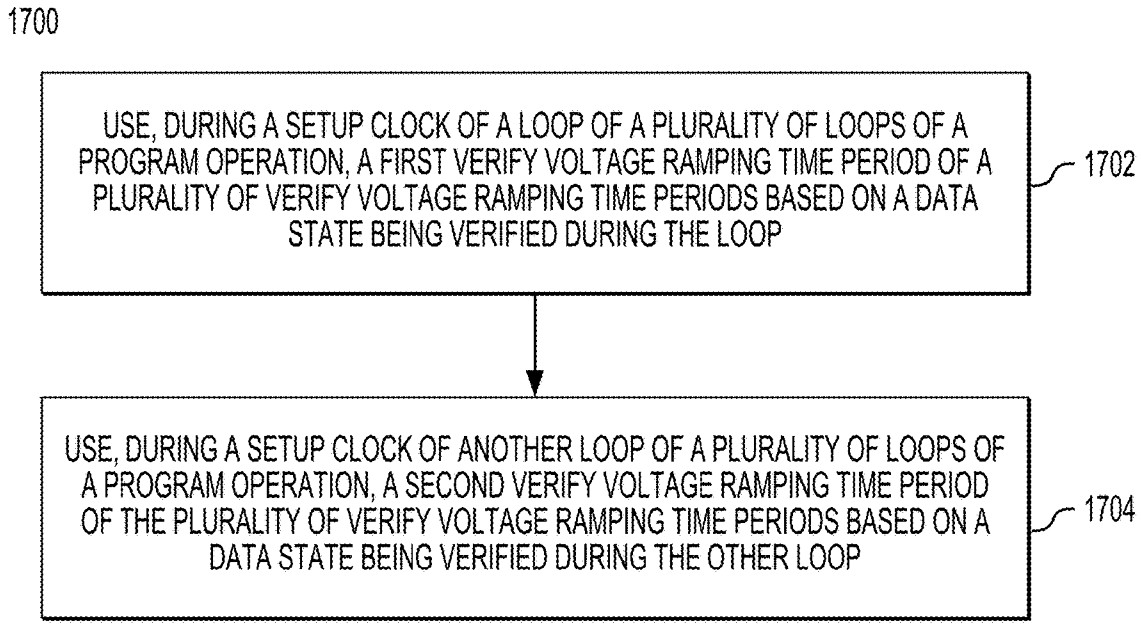

*FIG. 17*

STATE DEPENDENT VERIFY VOLTAGE RAMPING TIME PERIODS FOR A PROGRAM-VERIFY OPERATION FOR PERFORMANCE GAIN

CROSS-REFERENCE TO RELATED APPLICATION

This application is a Continuation-In-Part of U.S. patent application Ser. No. 18/649,382, filed on Apr. 29, 2024, and entitled "STATE DEPENDENT VERIFY VOLTAGE RAMPING TIME PERIODS FOR A PROGRAM-VERIFY OPERATION FOR PERFORMANCE GAIN," the entire contents of which is herein incorporated by reference.

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory apparatuses have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory apparatuses to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

SUMMARY

This section provides a general summary of the present disclosure and is not a comprehensive disclosure of its full scope or all of its features and advantages.

An object of the present disclosure is to provide a memory apparatus and a method of operation of the memory apparatus that address and overcome shortcomings described herein.

Accordingly, it is an aspect of the present disclosure to an apparatus. The apparatus comprises a plurality of memory cells connected to word lines and bit lines and configured to retain a threshold voltage corresponding to one of a plurality of data states following a program operation; and a control circuit connected to the word lines and the bit lines. The control circuit is configured to: use, during a setup clock of a loop of a plurality of loops of a program-verify operation, a first verify voltage ramping time period of a plurality of verify voltage ramping time periods based on a data state being verified during the loop; and use, during a setup clock of another loop of a plurality of loops of a program-verify operation, a second verify voltage ramping time period of the plurality of verify voltage ramping time periods based on a data state being verified during the other loop.

Accordingly, it is another aspect of the present disclosure a method of operating a non-volatile semiconductor memory device. The method comprises: using, during a setup clock of a loop of a plurality of loops of a program-verify operation, a first verify voltage ramping time period of a plurality of verify voltage ramping time periods based on a data state of a plurality of data states being verified during the loop; and using, during a setup clock of another loop of a plurality of loops of a program-verify operation, a second verify voltage ramping time period of the plurality of verify voltage ramping time periods based on a data state the plurality of data states being verified during the other loop.

Accordingly, it is another aspect of the present disclosure to an apparatus comprising: a means for using, during a setup clock of a loop of a plurality of loops of a program-verify operation, a first verify voltage ramping time period of a plurality of verify voltage ramping time periods based on a data state of a plurality of data states being verified during the loop; and a means for using, during a setup clock of another loop of a plurality of loops of a program-verify operation, a second verify voltage ramping time period of the plurality of verify voltage ramping time periods based on a data state of the plurality of data states being verified during the other loop.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

For a detailed description of example embodiments, reference will now be made to the accompanying drawings in which:

FIG. 2 depicts blocks of memory cells in an example two-dimensional configuration of the memory array of FIG. 1;

FIG. 7A depicts a top view of an example word line layer WLL0 of the stack of FIG. 6B;

FIG. 7B depicts a top view of an example top dielectric layer DL19 of the stack of FIG. 6B;

FIG. 8A depicts example NAND strings in the sub-blocks SBa-SBd of FIG. 7A;

FIG. 16 provides a graphical representation of verify voltage ramping time periods for different states during the memory program-verify process; and FIG. 17 illustrates steps of one example method for state dependent verify voltage ramping time periods for program-verify operation for performance, in accordance with embodiments described herein.

DETAILED DESCRIPTION

Figure 1A:
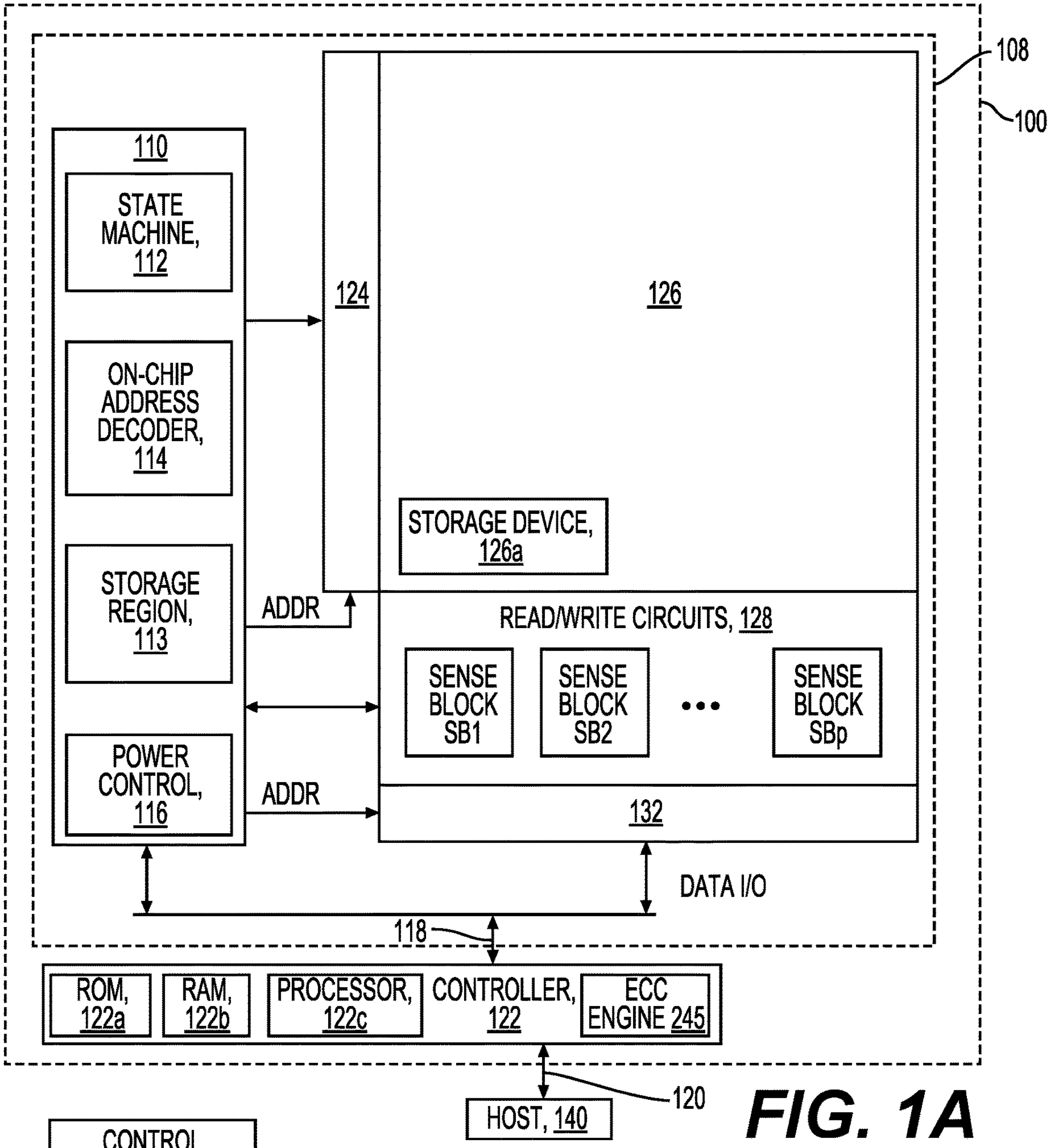
FIG. 1A is a block diagram of an example memory device.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of forming of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

Examples of non-volatile memory systems include flash memory, such as NAND flash or NOR flash. NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. NAND flash memory may be scaled in order to reduce cost per bit.

Program-verify operation is a critical, yet time-intensive process. Program-verify operation comprises two distinct operations: the programming of memory cells and the program verification. The latter is the focus of the disclosure, with a specific emphasis on enhancing its efficiency to improve the overall program performance. The verify phase has potential for optimization, particularly through the adjustment of a duration of a setup clock of the program-verify operation (also referred to as R2_PVFY clock herein). More specifically, minimizing the setup clock duration can allow for an enhancement in program performance. Any improvement can be substantial, considering the scale at which memory devices operate and the cumulative effect on system performance.

However, overly aggressive minimization of the setup clock duration can precipitate the injection of read disturb (RD) type errors, compromising data integrity. The object of the disclosure is to accelerate the programming process without compromising the integrity and reliability of the memory device. In particular, the intent is to minimize the duration of the setup clock to a feasible limit. Given that program-verify operation typically undergoes several loops (e.g., ten to thirteen loops), which each loop comprises multiple verification operations, the cumulative time savings by minimization of the setup clock is substantial. Embodiments disclosed herein are directed to overcoming this issue while minimizing the duration of the setup clock.

To help further illustrate the foregoing, FIG. 1A will now be described. FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for verify parameters as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to program memory cells of a word line of a block and verify the set of the memory cells. The control circuits can also include a counting circuit configured to determine a number of memory cells that are verified to be in a data state. The control circuits can also include a determination circuit configured to determine, based on the number, whether the block is faulty.

Figure 1B:
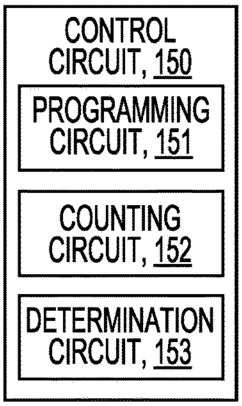
FIG. 1B is a block diagram of an example control circuit which comprises a programming circuit, a counting circuit, and a determination circuit.

For example, FIG. 1B is a block diagram of an example control circuit 150 which comprises a programming circuit 151, a counting circuit 152 and a determination circuit 153. The programming circuit may include software, firmware and/or hardware. The counting circuit may include software, firmware and/or hardware which implements. The determination circuit may include software, firmware and/or hardware which implements.

The off-chip controller 122 may comprise a processor 122*c*, storage devices (memory) such as ROM 122*a* and RAM 122*b* and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller 122 to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

In embodiments, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The smallest piece of a NAND flash die is a cell, and each cell is stored in a page. Each page can be written to, and they are the smallest piece of the NAND flash that can store data or be programmed. Groups of pages are called blocks. There may be over 100 pages in each block. Because multiple pages are contained in each block, blocks can store a large amount of data. When it is necessary to erase part of the data stored in the NAND flash memory, it can only be erased by block. It is not possible to erase smaller or larger groups of data within a NAND flash die.

When blocks are grouped together, they form planes. Planes then form NAND flash dies. Dies can contain a single plane full of data blocks, or they may feature multiple planes that have been linked together. The number and configurations of planes within the NAND flash die is adaptable.

Further, the memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 2 depicts blocks of memory cells in an example two-dimensional configuration of the memory array 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
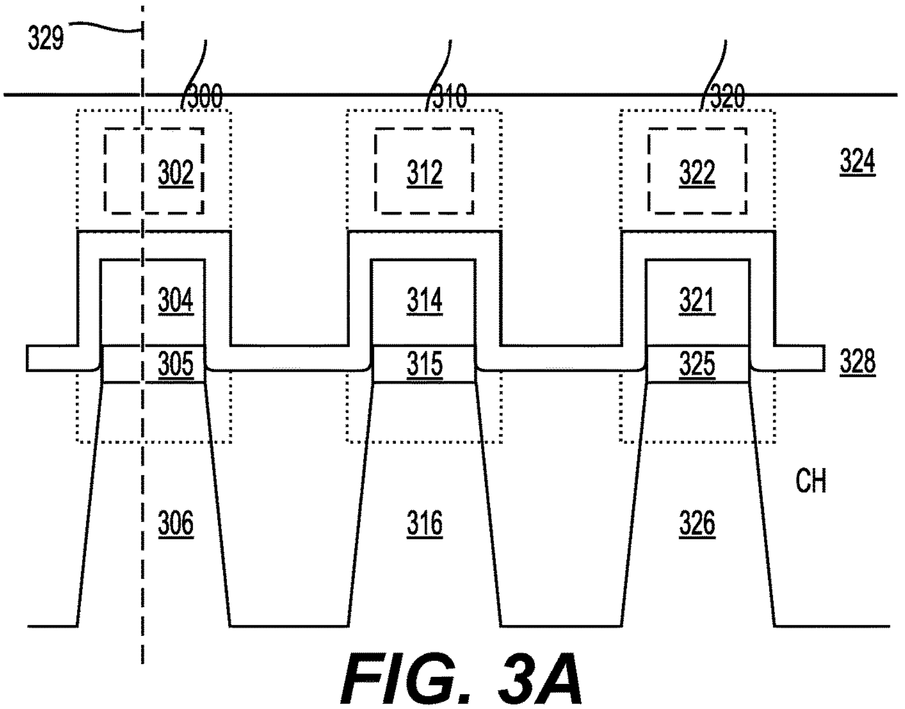
FIG. 3A depicts a cross-sectional view of example floating gate memory cells in NAND strings.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
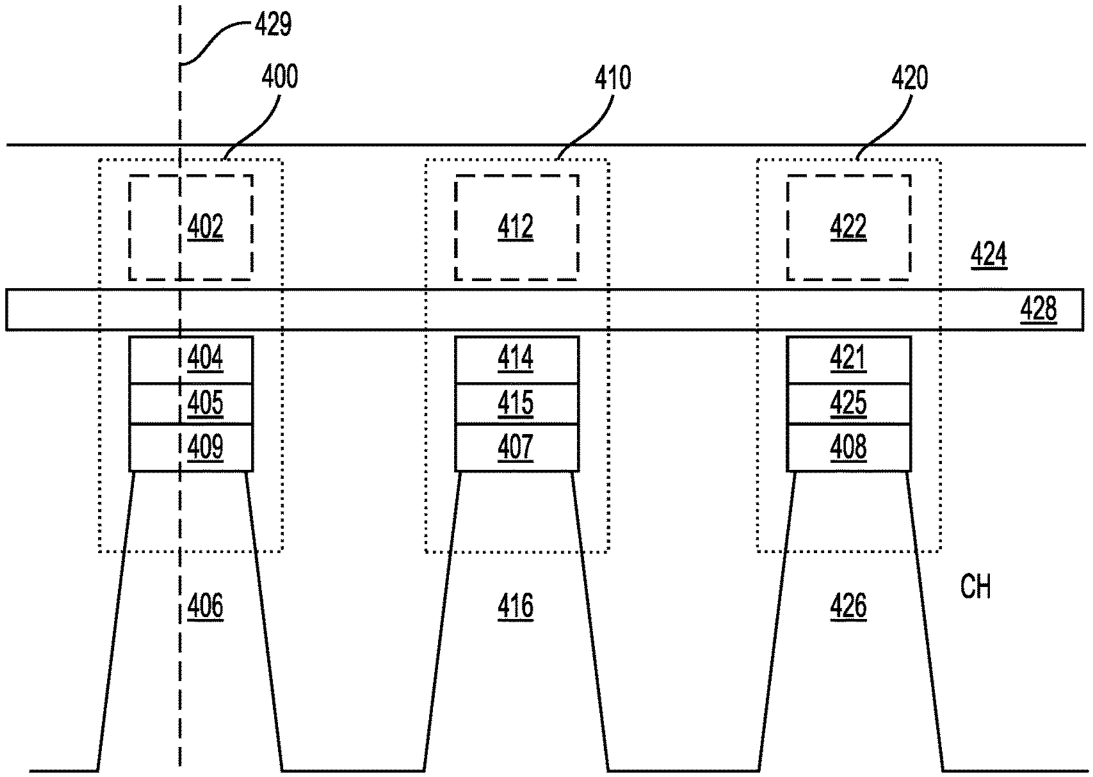
FIG. 4A depicts a cross-sectional view of example charge-trapping memory cells in NAND strings.
Figure 4B:
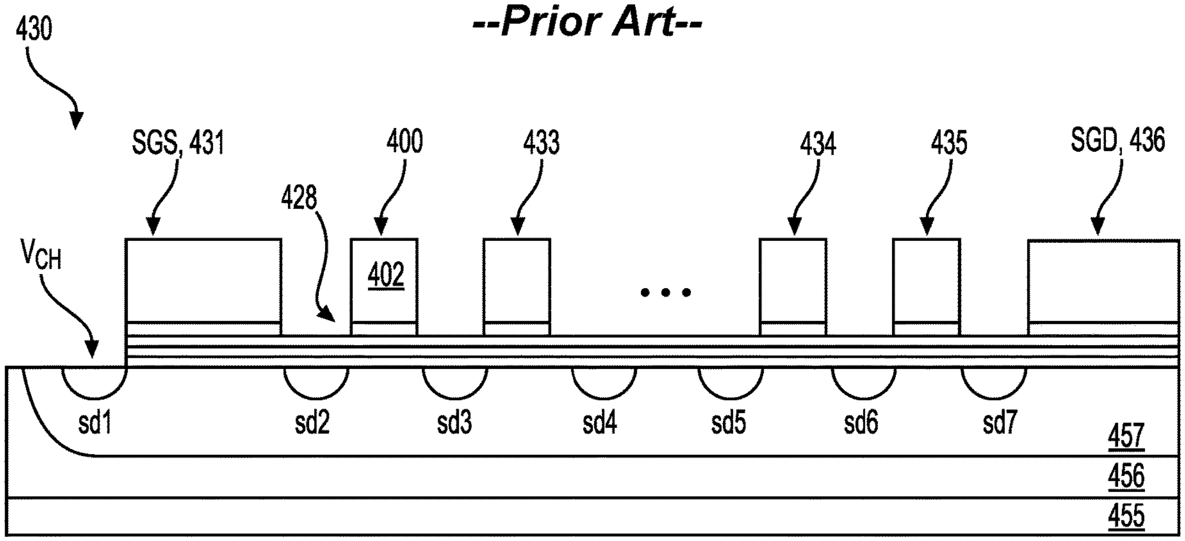
FIG. 4B depicts a cross-sectional view of the structure of FIG. 4A along line 429.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
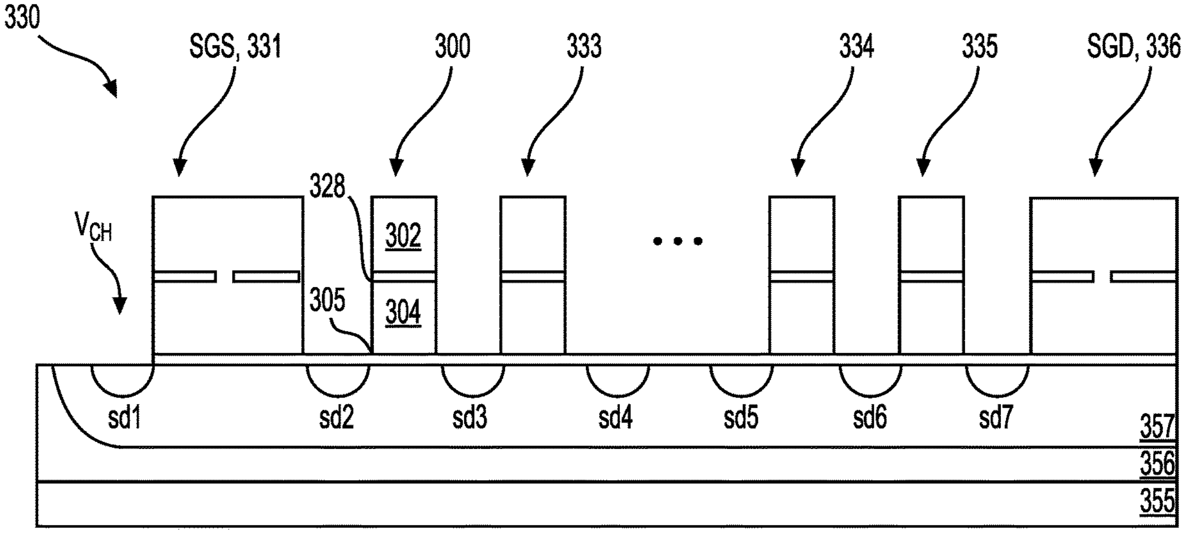
FIG. 3B depicts a cross-sectional view of the structure of FIG. 3A along line 329.

FIG. 3B depicts a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1. Charge-trapping memory can be used in NOR and NAND flash memory device. This technology uses an insulator such as a SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 436.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5A:
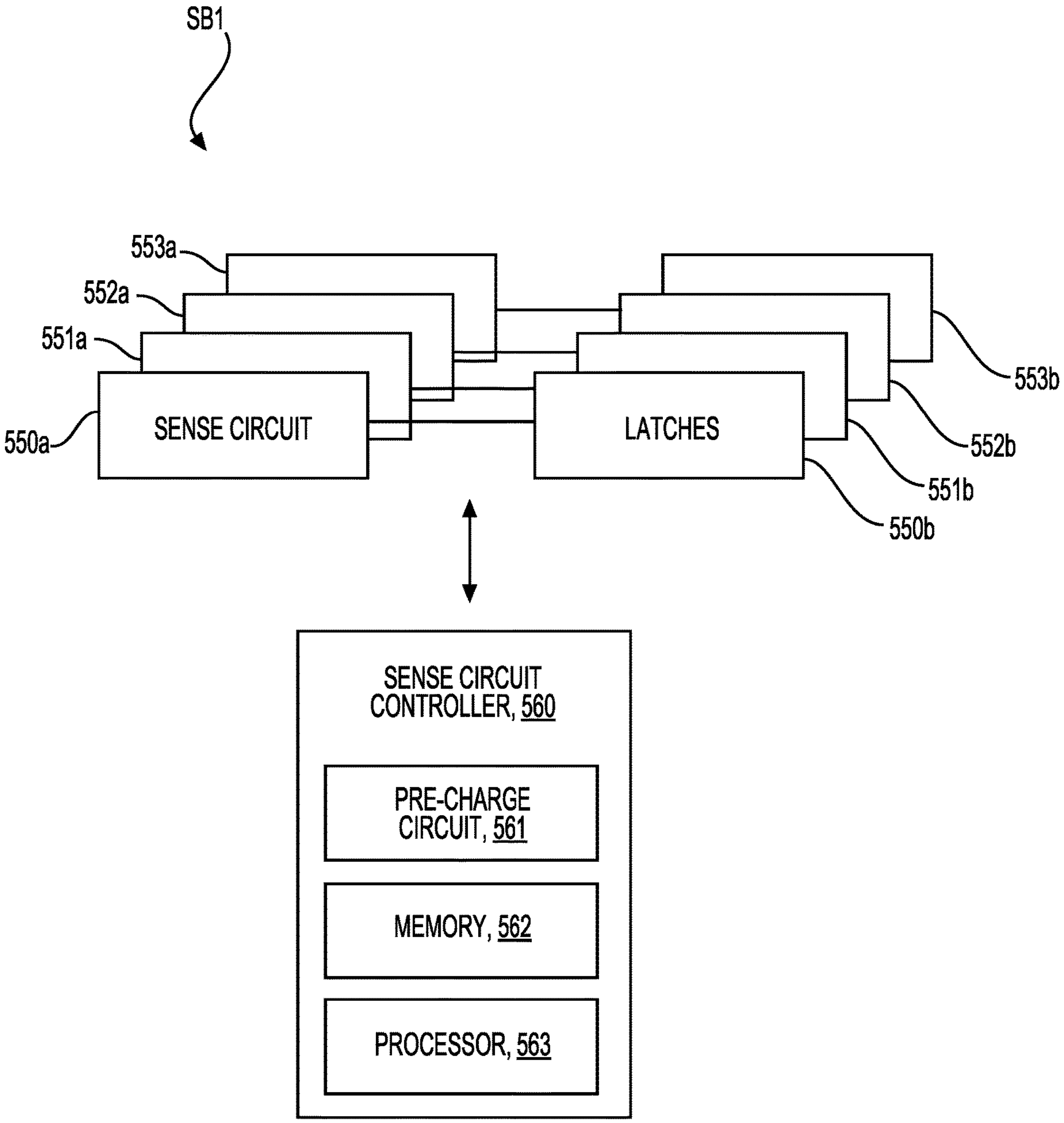
FIG. 5A depicts an example block diagram of the sense block SB1 of FIG. 1.

FIG. 5A depicts an example block diagram of the sense block SB1 of FIG. 1. In one approach, a sense block comprises multiple sense circuits. Each sense circuit is associated with data latches. For example, the example sense circuits 550*a*, 551*a*, 552*a* and 553*a* are associated with the data latches 550*b*, 551*b*, 552*b* and 553*b*, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller may include a pre-charge circuit 561 which provides a voltage to each sense circuit for setting a pre-charge voltage. In one possible approach, the voltage is provided to each sense circuit independently, e.g., via the data bus, DBUS 503 and a local bus such as LBUS1 or LBUS2 in FIG. 5B. In another possible approach, a common voltage is provided to each sense circuit concurrently, e.g., via the line 505 in FIG. 5B. The sense circuit controller may also include a memory 562 and a processor 563. As mentioned also in connection with FIG. 2, the memory 562 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 550*a* and 551*a* are provided below.

Figure 5B:
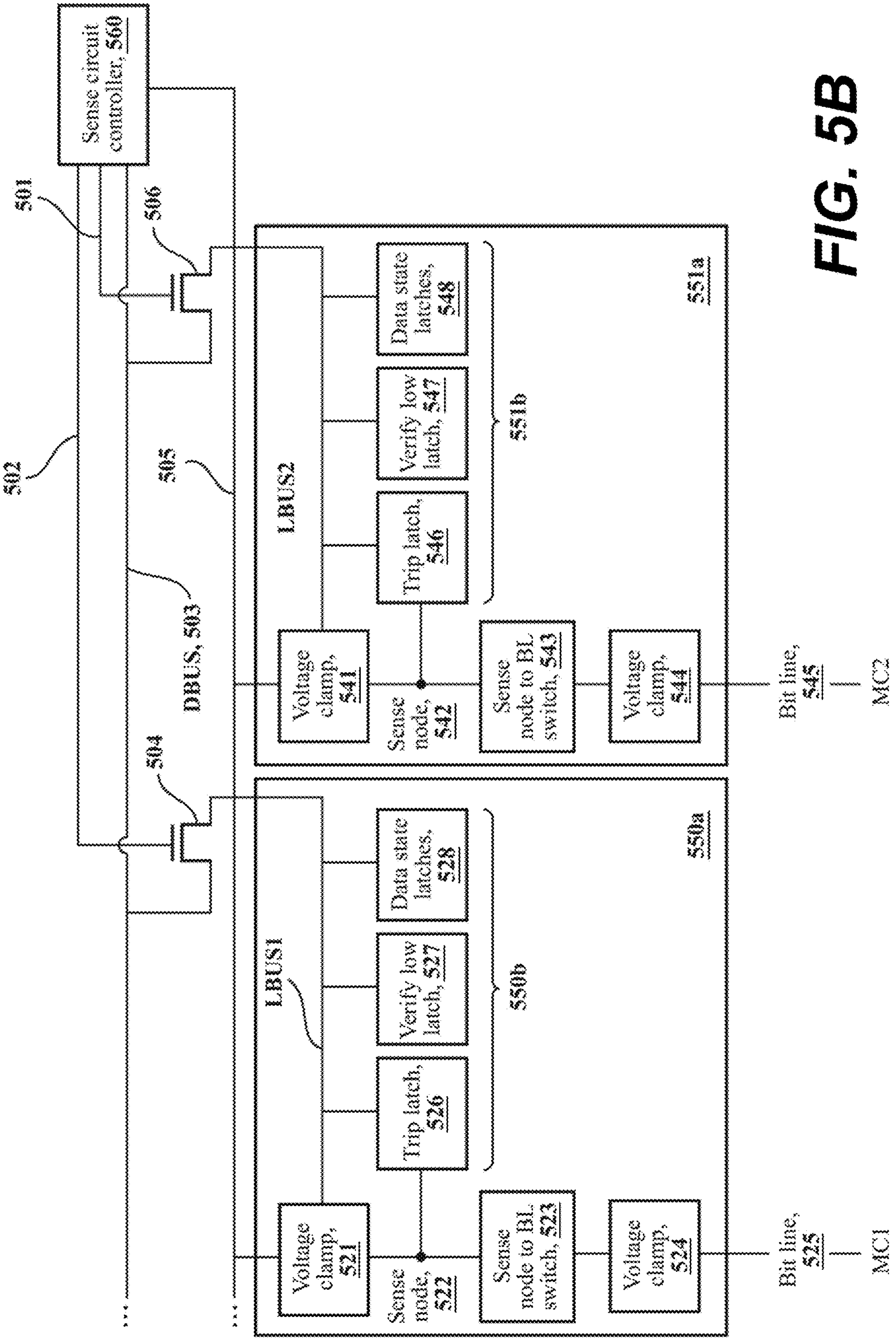
FIG. 5B depicts another example block diagram of the sense block SB1 of FIG. 1.

FIG. 5B depicts another example block diagram of the sense block SB1 of FIG. 1. The sense circuit controller 560 communicates with multiple sense circuits including example sense circuits 550*a* and 551*a*, also shown in FIG. 5A. The sense circuit 550*a* includes latches 550*b*, including a trip latch 526, an offset verify latch 527 and data state latches 528. The sense circuit further includes a voltage clamp 521 such as a transistor which sets a pre-charge voltage at a sense node 522. A sense node to bit line (BL) switch 523 selectively allows the sense node to communicate with a bit line 525, e.g., the sense node is electrically connected to the bit line so that the sense node voltage can decay. The bit line 525 is connected to one or more memory cells such as a memory cell MC1. A voltage clamp 524 can set a voltage on the bit line, such as during a sensing operation or during a program voltage. A local bus, LBUS1, allows the sense circuit controller to communicate with components in the sense circuit, such as the latches 550*b* and the voltage clamp in some cases. To communicate with the sense circuit 550*a*, the sense circuit controller provides a voltage via a line 502 to a transistor 504 to connect LBUS1 with a data bus DBUS, 503. The communicating can include sending data to the sense circuit and/or receive data from the sense circuit.

The sense circuit controller can communicate with different sense circuits in a time-multiplexed manner, for instance. A line 505 may be connected to the voltage clamp in each sense circuit, in one approach.

The sense circuit 551*a* includes latches 551*b*, including a trip latch 546, an offset verify latch 547 and data state latches 548. A voltage clamp 541 may be used to set a pre-charge voltage at a sense node 542. A sense node to bit line (BL) switch 543 selectively allows the sense node to communicate with a bit line 545, and a voltage clamp 544 can set a voltage on the bit line. The bit line 545 is connected to one or more memory cells such as a memory cell MC2. A local bus, LBUS2, allows the sense circuit controller to communicate with components in the sense circuit, such as the latches 551*b* and the voltage clamp in some cases. To communicate with the sense circuit 551*a*, the sense circuit controller provides a voltage via a line 501 to a transistor 506 to connect LBUS2 with DBUS.

The sense circuit 550*a* may be a first sense circuit which comprises a first trip latch 526 and the sense circuit 551*a* may be a second sense circuit which comprises a second trip latch 546.

The sense circuit 550*a* is an example of a first sense circuit comprising a first sense node 522, where the first sense circuit is associated with a first memory cell MC1 and a first bit line 525. The sense circuit 551*a* is an example of a second sense circuit comprising a second sense node 542, where the second sense circuit is associated with a second memory cell MC2 and a second bit line 545.

Figure 6A:
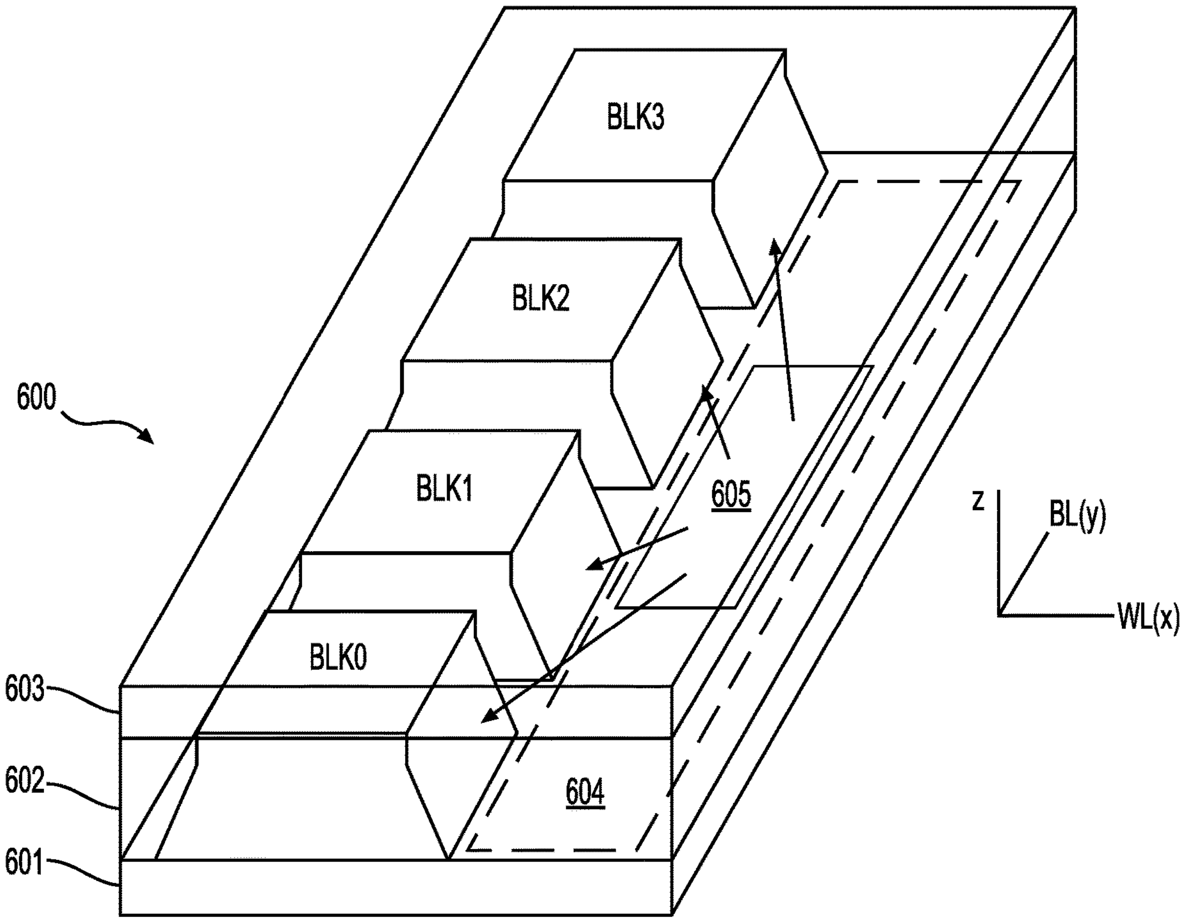
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
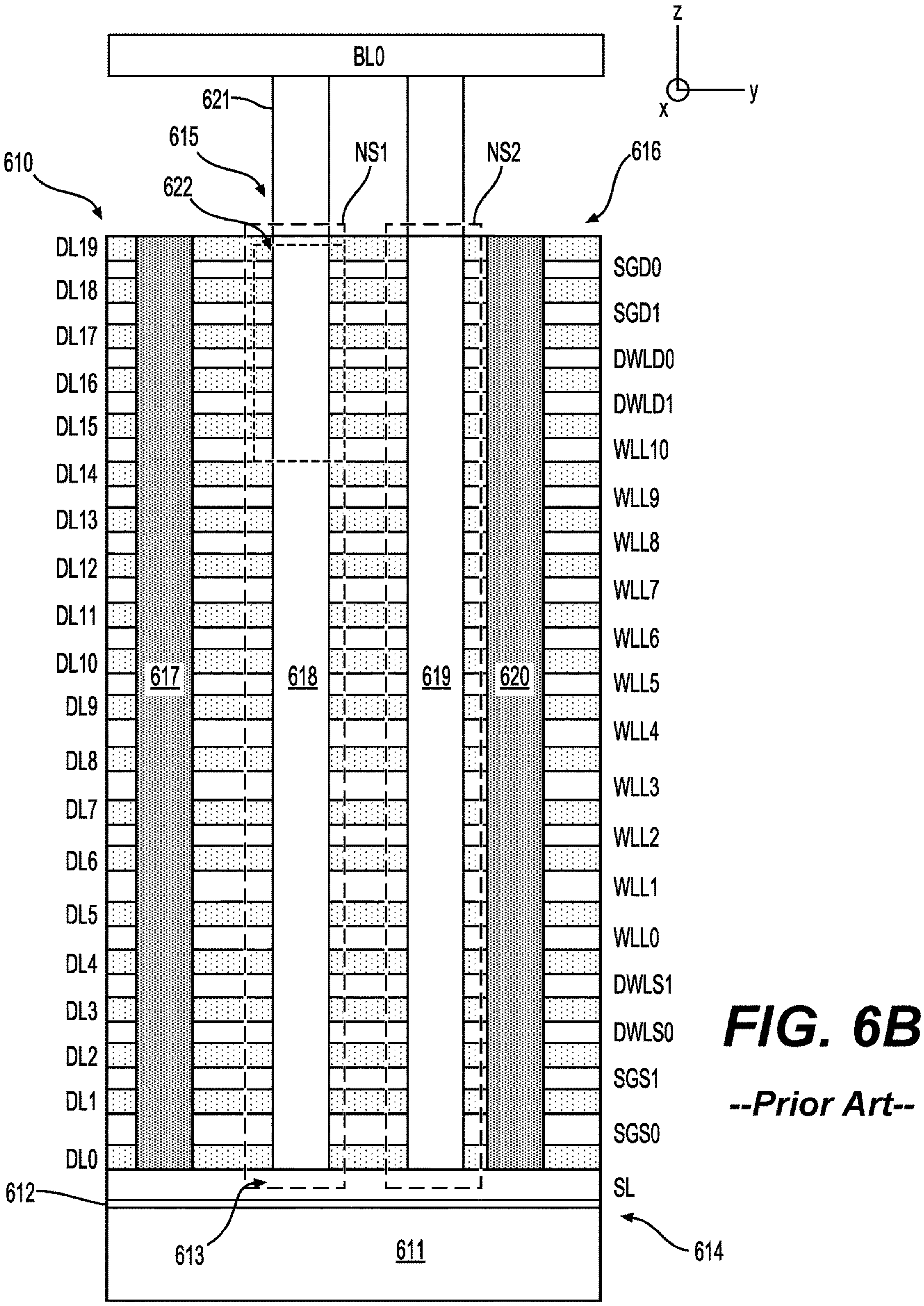
FIG. 6B depicts an example cross-sectional view of a portion of one of the blocks of FIG. 6A.

FIG. 6B depicts an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6C:
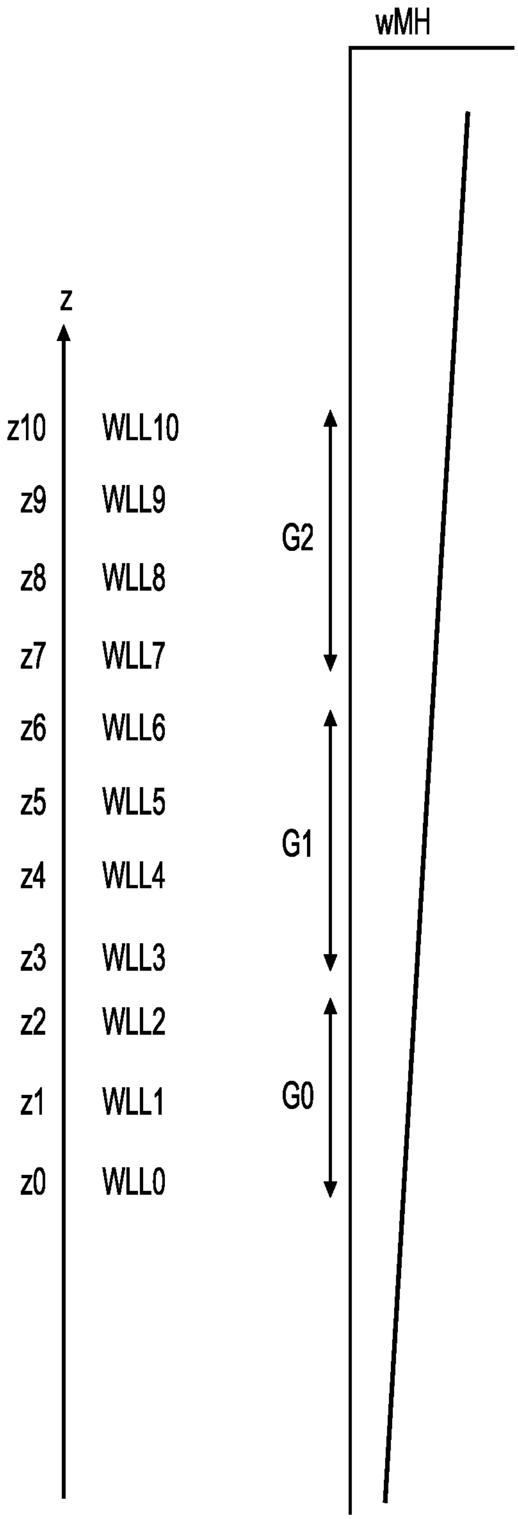
FIG. 6C depicts a plot of memory hole diameter in the stack of FIG. 6B.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
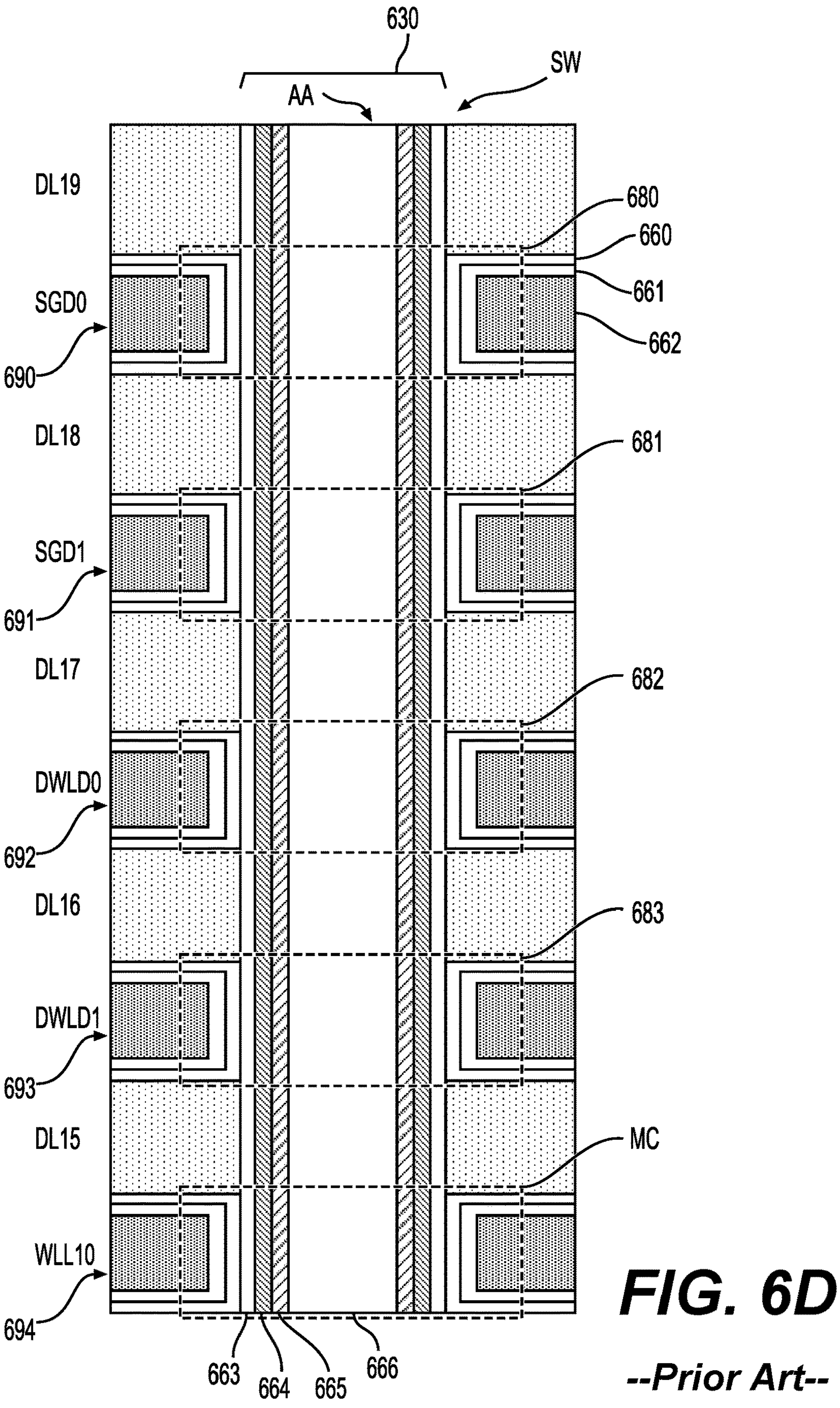
FIG. 6D depicts a close-up view of the region 622 of the stack of FIG. 6B.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7A depicts a top view of an example word line layer WLL0 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. For example, see the SGD lines/control gates SGD0, SGD1, SGD2 and SGD3 in the sub-blocks SBa, SBb, SBc and SBd, respectively. The sub-blocks SBa, SBb, SBc and SBd may also be referred herein as a string of memory cells of a word line. As described, a string of memory cells of a word line may include a plurality of memory cells that are part of the same sub-block, and that are also disposed in the same word line layer and/or that are configured to have their control gates biased by the same word line and/or with the same word line voltage.

Further, a word line layer in a block can be divided into regions. Each region is in a respective sub-block are can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figure and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0 *a*, WLL0 *b*, WLL0 *c* and WLL0 *d* which are each connected by a connector 713. The last region of a word line layer in a block can be connected to a first region of a word line layer in a next block, in one approach. The connector, in turn, is connected to a voltage driver for the word line layer. The region WLL0 *a* has example memory holes 710 and 711 along a line 712. The region WLL0 *b* has example memory holes 714 and 715. The region WLL0 *c* has example memory holes 716 and 717. The region WLL0 *d* has example memory holes 718 and 719. The memory holes are also shown in FIG. 7B. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 721 are in WLL0 *a*, memory cells 724 and 725 are in WLL0 *b*, memory cells 726 and 727 are in WLL0 *c*, and memory cells 728 and 729 are in WLL0 *d*. These memory cells are at a common height in the stack.

Metal-filled slits 701, 702, 703 and 704 (e.g., metal interconnects) may be located between and adjacent to the edges of the regions WLL0 *a*-WLL0 *d*. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B depicts a top view of an example top dielectric layer DL19 of the stack of FIG. 6B. The dielectric layer is divided into regions DL19 *a*, DL19 *b*, DL19 *c* and DL19 *d*. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19*a* has the example memory holes 710 and 711 along a line 712*a* which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the set of memory cells (e.g., including the memory cell 812) connected to another word line (e.g., WLL8) are at another height (z8) in the stack.

Figure 8B:
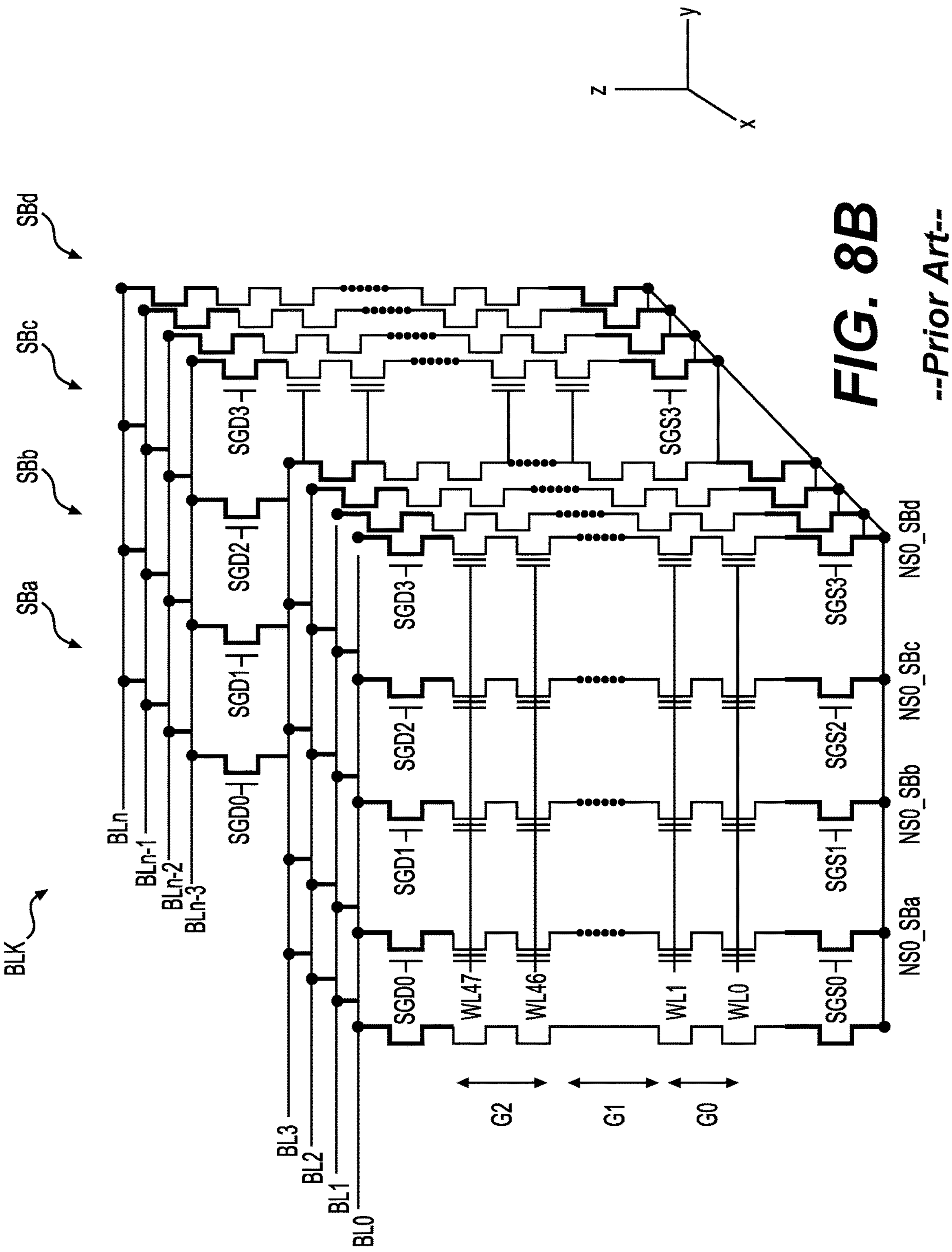
FIG. 8B depicts another example view of NAND strings in sub-blocks.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

Figure 8C:
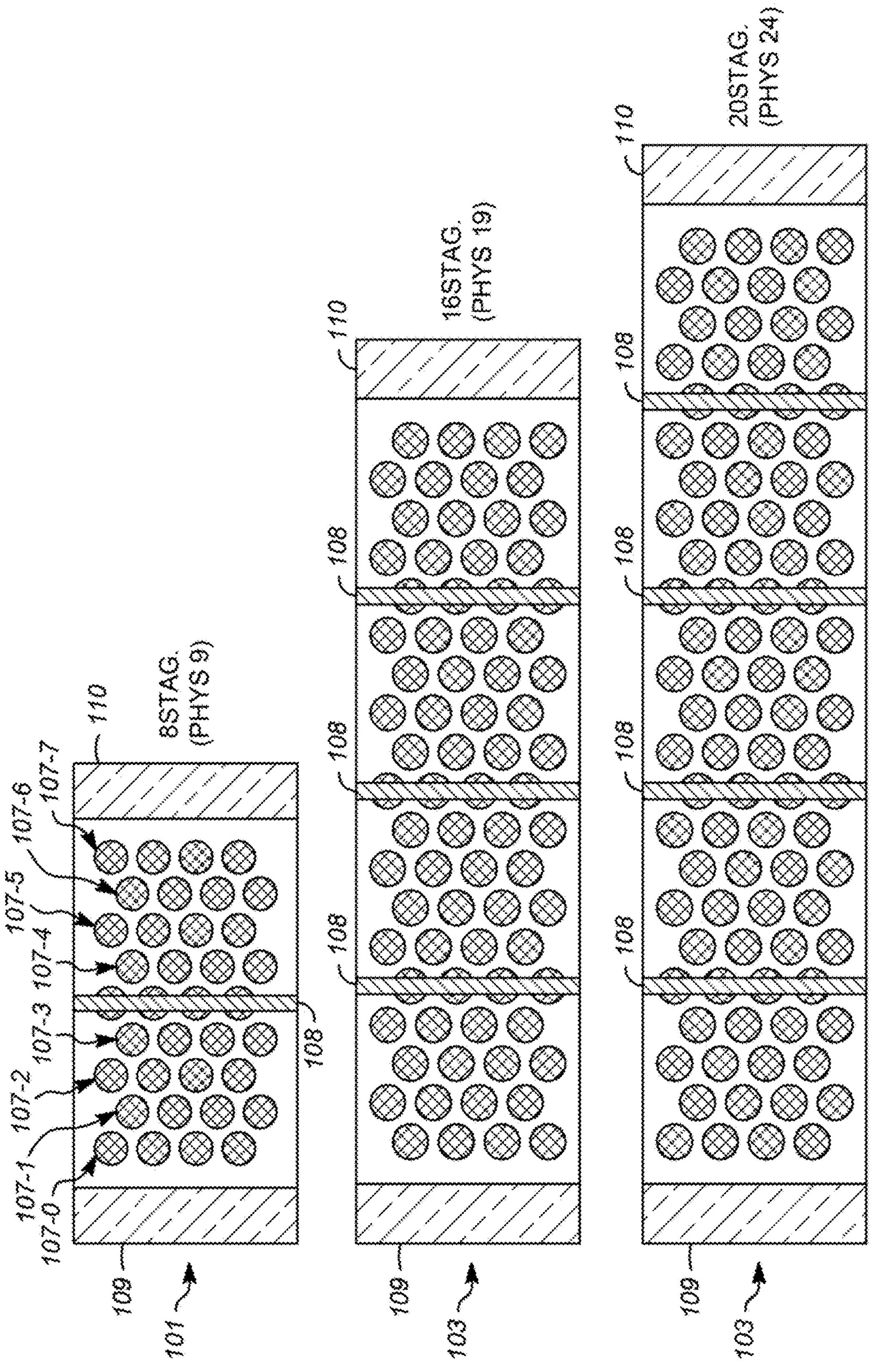
FIG. 8C depicts a top view of example word line layers of a stack.
Figure 9:
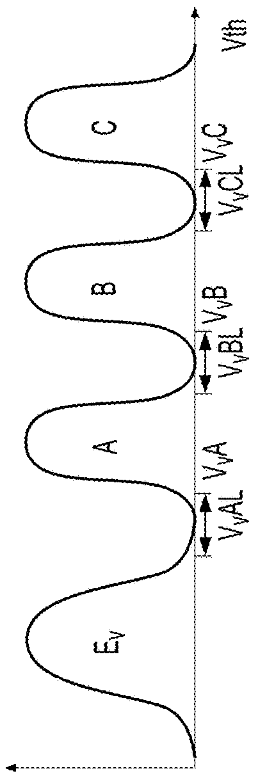
FIG. 9 depicts the Vth distributions of memory cells in an example one-pass programming operation with four data states.
Figure 10:
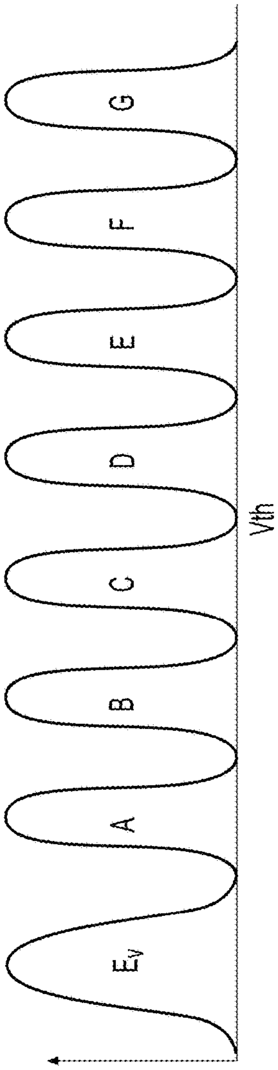
FIG. 10 depicts the Vth distributions of memory cells in an example one-pass programming operation with eight data states.
Figure 11:
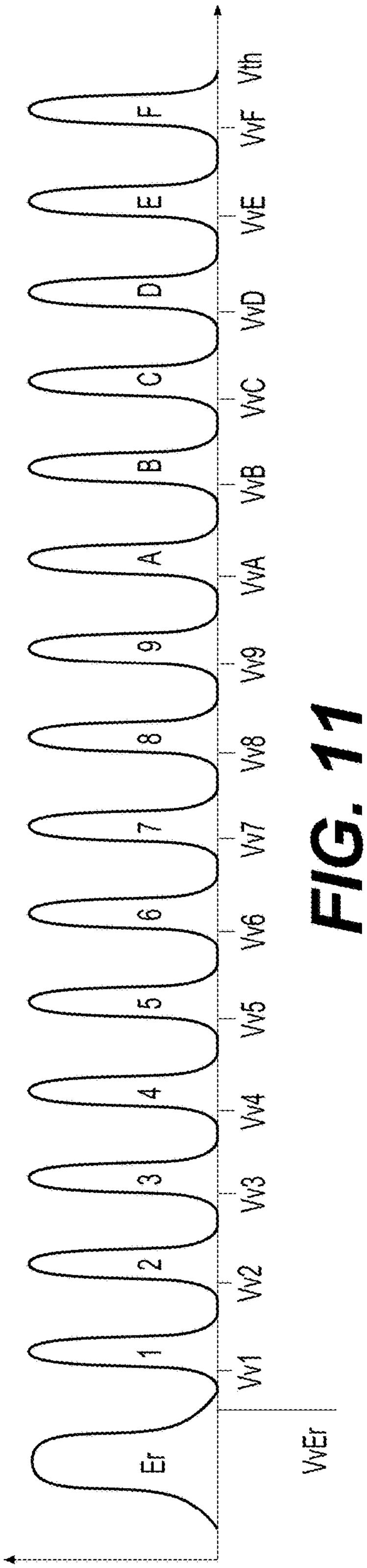
FIG. 11 depicts the Vth distributions of memory cells in an example one-pass programming operation with sixteen data states.

FIG. 8C generally illustrates a schematic view of three versions of staggered string architecture 101, 103, 105 for BiCS memory, e.g., NAND. With reference the string architecture 101, the strings are shown in rows 107-0 through 107-7 in architecture 101. Each row is shown with four ends to the strings. A string may be connected to an adjacent string at an end (not visible beneath this view). A first group of rows 107-0 through 107-3 are shown on a left side of a dummy row 108. A second group of rows 107-4 through 107-7 are shown on a right side of the dummy row 108. The dummy row 108 separates the two groups of rows in the staggered eight rows. A source line 109 is positioned at an edge of the first group and is remote from the dummy row 108. A source line 110 is positioned at an edge of the second group and is remote from the dummy row 108 and source line 109.

The staggered string architectures 103, 105 for BiCS memory are similar to that of architecture 101 except additional groups are added. Architecture 103 is double the size of architecture 101 and includes sixteen rows of strings with each group of four rows separated by a dummy row. Architecture 105 is larger than both the architecture 101 and the architecture 103. Architecture 105 includes twenty rows of strings with each group of four rows separated by a dummy row 108.

These architectures 101, 103, 105 can include a chip under array structure, e.g., the control circuitry is under the memory array that can include the groups of memory strings. With the chip under array structure, the strings may include a direct strap contact for the source line for read and erase operations.

Figure 12:
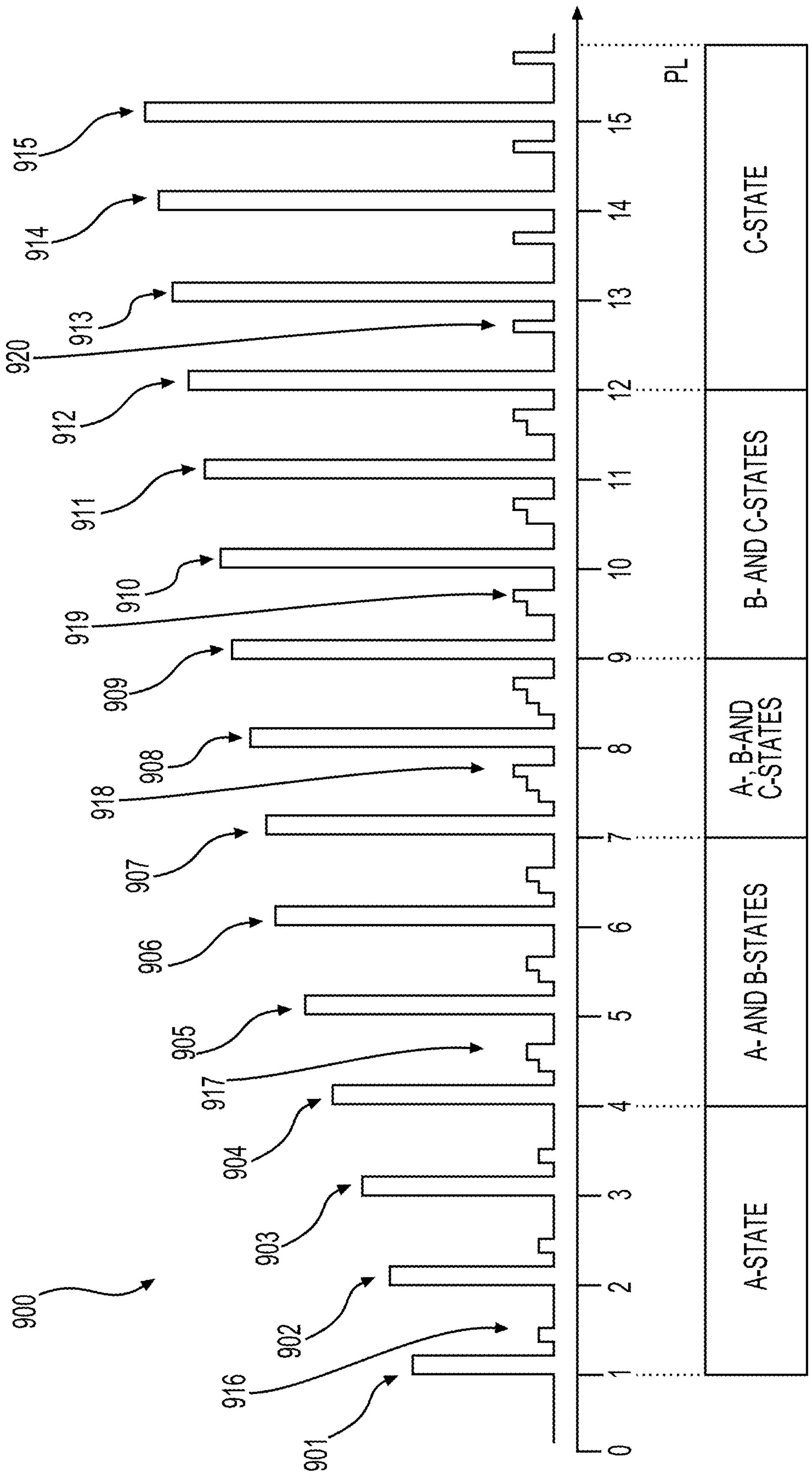
FIG. 12 is a schematic voltage waveform for an example programming operation in a memory device.

FIG. 12 depicts a waveform of an example programming operation. The horizontal axis depicts a program loop number and the vertical axis depicts control gate or word line voltage. Generally, a programming operation can involve applying a pulse train to a selected word line, where the pulse train includes multiple program loops or program-verify (PV) iterations. The program portion of the program-verify iteration comprises a program voltage, and the verify portion of the program-verify iteration comprises one or more verify voltages.

For each program voltage, a square waveform is depicted for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming stage in which the programming is completed. ISPP can also be used in each programming stage of a multi-stage operation.

A pulse train typically includes program voltages which increase stepwise in amplitude in each program-verify iteration using a fixed of varying step size. A new pulse train can be applied in each programming stage of a multi-stage programming operation, starting at an initial Vpgm level and ending at a final Vpgm level which does not exceed a maximum allowed level. The initial Vpgm levels can be the same or different in different programming stages. The final Vpgm levels can also be the same or different in different programming stages. The step size can be the same or different in the different programming stages. In some cases, a smaller step size is used in a final programming stage to reduce Vth distribution widths.

The pulse train 900 includes a series of program voltages 901, 902, 903, 904, 905, 906, 907, 908, 909, 910, 911, 912, 913, 914 and 915 that are applied to a word line selected for programming, and an associated set of non-volatile memory cells. One, two or three verify voltages are provided after each program voltage as an example, based on the target data states which are being verified. 0 V may be applied to the selected word line between the program and verify voltages. For example, an A-state verify voltage of VvA (e.g., waveform or programming signal 916) may be applied after each of the first, second and third program voltages 901, 902 and 903, respectively. A- and B-state verify voltages of VvA and VvB (e.g., programming signal 917) may be applied after each of the fourth, fifth and sixth program voltages 904, 905 and 906, respectively. A-, B- and C-state verify voltages of VvA, VvB and VvC (e.g., programming signal 918) may be applied after each of the seventh and eighth program voltages 907 and 908, respectively. B- and C-state verify voltages of VvB and VvC (e.g., programming signal 919) may be applied after each of the ninth, tenth and eleventh program voltages 909, 910 and 911, respectively. Finally, a C-state verify voltage of VvC (e.g., programming signal 1020) may be applied after each of the twelfth, thirteenth, fourteenth and fifteenth program voltages 912, 913, 914 and 915, respectively.

Figure 13A:
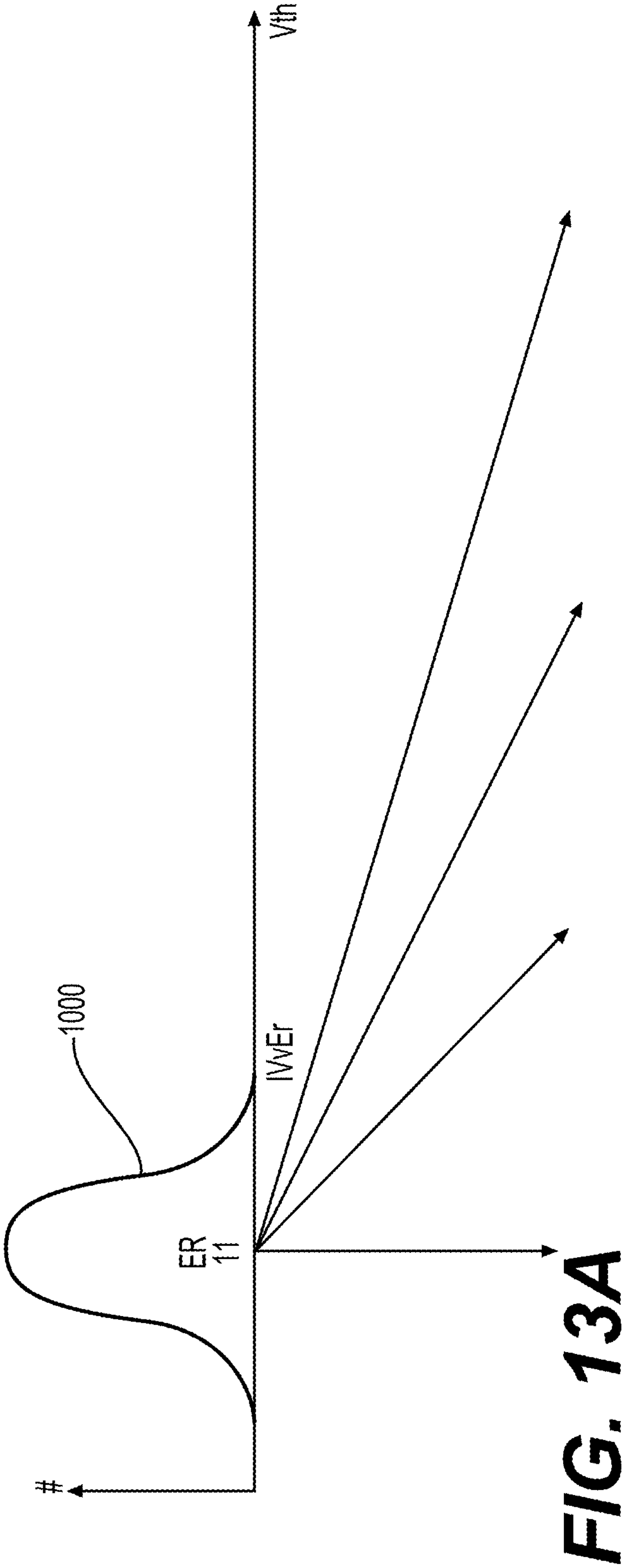
FIGS. 13A and 13B depict the Vth distributions of memory cells.
Figure 13B:
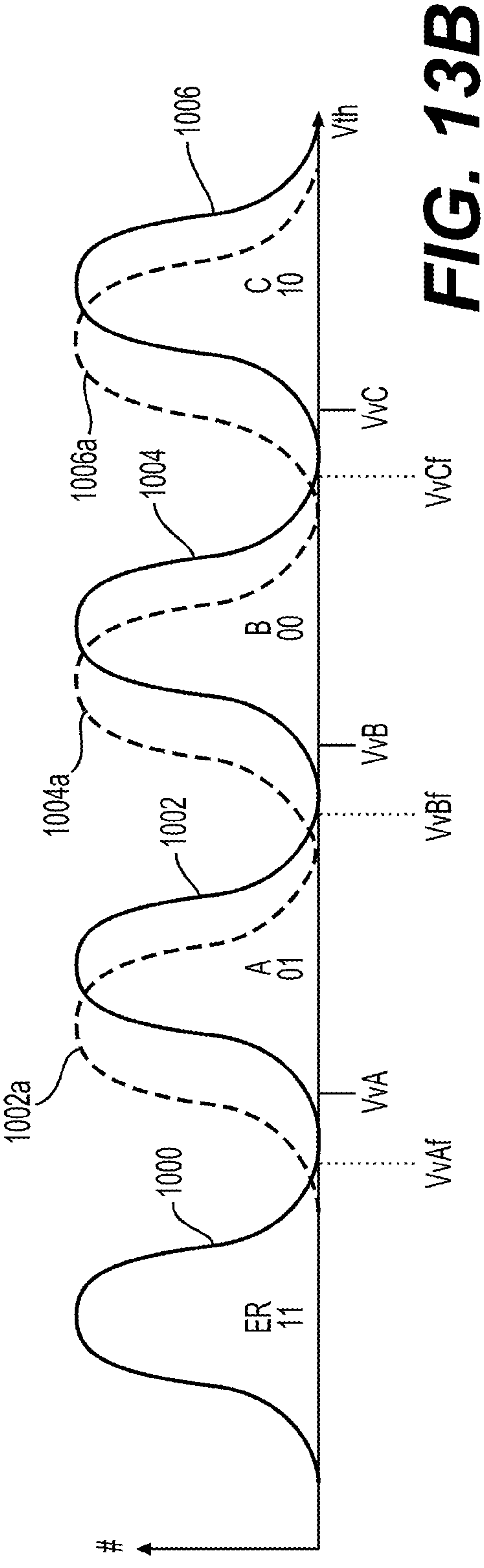

FIGS. 13A and 13B show threshold voltage (Vt) distributions of memory cells in an example two-stage programming operation. Specifically, the memory cells are initially in the erased state (bits 11) as represented by the Vth distribution 1000 shown in FIG. 13A. FIG. 13B depicts Vth distributions of memory cells after a first programming stage and a second programming stage of the example two-stage programming operation with four data states. While two programming stages and four data states are shown, it should be appreciated that any number of programming stages may be utilized (e.g., one, three or four programming stages) and any number of data states are contemplated.

In the example, the first programming stage causes the Vth of the A, B and C state cells to reach the Vth distributions 1002*a*, 1004*a* and 1006*a*, using first verify voltages of VvAf, VvBf and VvCf, respectively. This first programming stage can be a rough programming which uses a relatively large step size, for instance, so that the Vth distributions 1002*a*, 1004*a* and 1006*a* are relatively wide. The second programming stage may use a smaller step size and causes the Vth distributions 1002*a*, 1004*a* and 1006*a* to transition to the final Vth distributions 1002, 1004 and 1006 (e.g., narrower than Vth distributions 1002*a*, 1004*a* and 1006*a*), using second verify voltages of VvA, VvB, and VvC, respectively. This two-stage programming operation can achieve relatively narrow Vth distributions. A small number of A, B and C state cells (e.g., smaller than a predetermined number of the plurality of memory cells) may have a Vth which is below VvA, VvB or VvC, respectively, due to a bit ignore criteria.

Program-verify operation is a critical, yet time-intensive process. Program-verify operation comprises two distinct operations: the programming of memory cells and the program verification. The latter is the focus of the disclosure, with a specific emphasis on enhancing its efficiency to improve the overall program performance. The verify phase has potential for optimization, particularly through the adjustment of a duration of a setup clock of the program-verify operation (also referred to as R2_PVFY clock herein). The setup clock may occur before the program-verify and during the setup clock the memory cells may be initialized and prepared for the upcoming program verify operation. For example, during a setup clock for a loop of a program-verify operation, a particular verify voltage ramping time period may be used. The particular verify voltage ramping time period that is applied during the setup clock may be based on a data state being verified during the loop. More specifically, minimizing the setup clock duration can allow for an enhancement in program performance. Any improvement can be substantial, considering the scale at which memory devices operate and the cumulative effect on system performance.

However, overly aggressive minimization of the setup clock duration can precipitate the injection of read disturb (RD) type errors, compromising data integrity. The object of the disclosure is to accelerate the programming process without compromising the integrity and reliability of the memory device. In particular, the intent is to minimize the duration of the setup clock to a feasible limit. Given that program-verify operation typically undergoes several loops (e.g., ten to thirteen loops), which each loop comprises multiple verification operations, the cumulative time savings by minimization of the setup clock is substantial. Embodiments disclosed herein are directed to overcoming this issue while minimizing the duration of the setup clock.

Current design limitations prevent the setup clock from being reduced to its minimum. Notably, the minimization of the setup clock leads to complications with injection type RD induced state width widening, particularly for the lower states. This phenomenon suggests a broadening of the threshold (VT) range for lower states (e.g., A, B, C for TLC memory configuration) when the setup clock is minimized. In contrast, for higher states (e.g., D, E, F, and G for a TLC memory configuration), the minimization of the setup clock does not significantly affect their VT range.

This suggests that while the benefits of minimizing the setup clock are considerable, practical constraints necessitate a more measured approach to ensure the reliability and functionality of the memory device. One issue is related to the interaction between adjacent wordlines during the program-verify operation. When a wordline is programmed, its threshold voltage (VT) distributions are within expected parameters. However, after the subsequent programming of an adjacent wordline, particularly with a shortened R2_PVFY clock duration, a significant impact to the VT distribution of the wordline may occur, such as a pronounced upper tail in the VT distribution. This phenomenon indicates a degradation in the VT distribution of a previously programmed wordline when a neighboring wordline is programmed, especially under conditions of a shortened R2_PVFY duration. Embodiments disclosed herein are directed to overcoming this issue while minimizing the duration of the setup clock.

Figure 14:
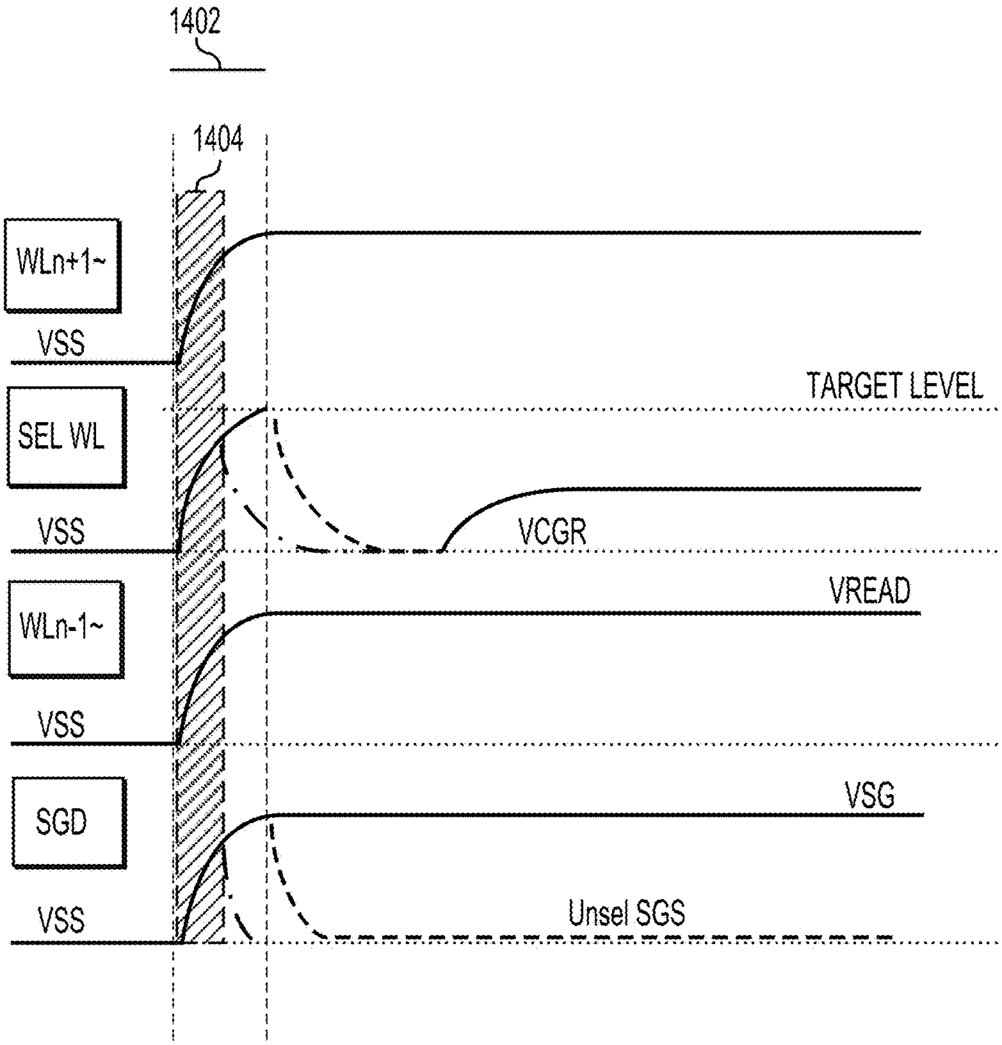
FIG. 14 represents an aggregate of signals across all clocks involved in the program-verify operation, in accordance with embodiments described herein.

Within the program-verify operation, various clocks are responsible for distinct tasks. Clocks as used herein refers to the timing signals that coordinate various stages of the program-verify operation. For example, FIG. 14 represents an aggregate of signals across all clocks involved in the program-verify operation. In FIG. 14, clock 1402 includes a setup clock of a program-verify operation and involves the voltage ramping of word lines, such as selected word line for programming and verification (e.g., SEL WL in FIG. 14) and unselected word lines (e.g., WLn+1 and WLn−1 in FIG. 14). For example, in the R2_PVFY clock, the voltage of the selected wordline is ramped from a base level (VSS) to a target level and unselected word lines are ramped up from a base level to a read voltage (VREAD). This ramping is essential for opening the channel, allowing the verify operation to proceed. Because the wordlines above the selected wordline are already programmed to high states, without applying sufficient voltage, the channel beneath these wordlines could remain off, preventing the verification process.

In FIG. 14, a clock 1404 depicts a representation of a minimization of clock 1402. In particular, the minimization of the setup clock of the program-verify operation can be problematic for the selected wordline. For example, initially, the selected wordline ramps up to the target level. However, after this initial ramping, it needs to ramp down to a specific voltage level for verification (e.g., a voltage at control gate read, VCGR). The challenge arises when the R2_PVFY clock duration is minimized. With a longer R2_PVFY clock duration, this voltage ramping process can be fully realized, allowing all wordlines to reach the target voltage level, and subsequently, the selected wordline can be ramped down to its verification level. However, when the R2_PVFY clock duration is too short, the selected wordline's ramp-up process is incomplete. While the unselected wordlines will still reach the target voltage level (as their ramping up is not constrained by R2_PVFY clock duration), the selected wordline might only reach a lower voltage before it starts ramping down due to the end of the R2_PVFY clock. Consequently, the channel under these cells does not open as required for proper verification.

In particular, the selected wordline, especially when verifying lower states like A-state, may ramp down to a very low or negative voltage after R2_PVFY clock. This may create a substantial potential difference across the channel, with one part at high voltage (e.g., 6V) and the other at a significantly lower voltage (e.g., −1V), leading to a large potential difference (e.g., 7V). Such a large potential difference can cause electrons to accelerate from the selected wordline towards the wordline N+1.

A similar issue may be observed for the ramping of the Selected Gate Drain (SGD) during a shortened R2_PVFY clock. For example, a memory block may consist of multiple strings. During programming or program verification, only one string may be actively programmed or verified. The unselected strings may be isolated using the SGD signal. As depicted in FIG. 14, the SGD also undergoes a ramp-up to a high level (e.g., select gate voltage, VSG) and then ramps down (e.g., unselected source side select gate, Unsel SGS), a process meant to inhibit unselected strings. If the R2 clock duration is too short, the SGD does not complete its ramp-up phase and remains off. When the channel is off, the area between the SGD and the selected wordline becomes floating, meaning it is electrically disconnected and its potential becomes uncertain. This floating channel tends to pick up potential from surrounding structures, particularly the wordlines above it.

Figure 15:
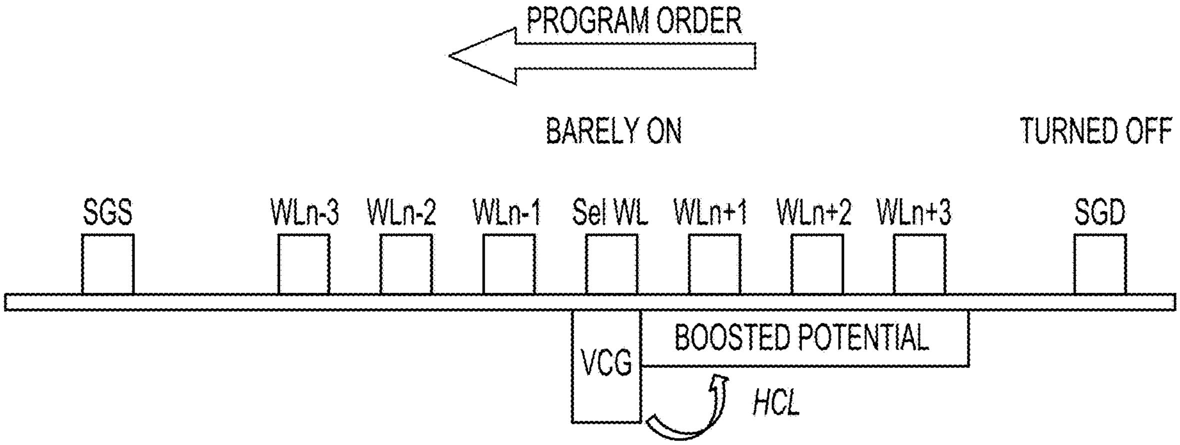
FIG. 15 provides a depiction of a memory programming-verification process, in accordance with embodiments described herein.

To help further illustrate, FIG. 15 provides a depiction of a memory programming process. During program verify, with reference to FIG. 15, if R2_PVFY is too short, then unselected SGD will be off in R2_PVFY. As WLn−1 is biased to read pass voltage, VREADK, the channel potential under WLn−1 will be boosted to VREADK, hence the injection can happen. The injection can happen when lower states (e.g., A, B or C state) are verified. As described, during lower states verify, selected CG may be bias to a relatively low voltage (e.g., ~1V), while other wordlines may be biased to a high voltage (e.g., ~7V). The large potential difference will lead to the carrier injection. While on the other hand, during verify of higher states (e.g., D, E, F or G state), the injection may not be an issue.

As such, embodiments disclosed herein are directed to a state dependent duration of a setup clock of a program-verify operation to further boost program performance. To help further illustrate, FIG. 16 provides a graphical representation of an exemplary implementation of R2_PVFY timing for different states during the memory program-verify process. The table represents the duration for the R2_PVFY or read voltage ramping time for states. For example, for lower states (e.g., A, B, and C), the R2_PVFY duration is indicated as t1 (e.g., 2 μs), which as depicted in FIG. 16 is a longer verify time than is allocated for higher states. In contrast, for higher states (e.g., states D and E), the R2_PVFY duration is reduced (e.g., to 0.07 μs). In FIG. 16, two distinct setup clock durations are employed. However, other embodiments may be adapted to accommodate the implementation of any number of setup clock durations as needed. For example, some embodiments may include a corresponding setup clock duration for each state that requires verification.

FIG. 17 illustrates steps of one example method 1700 for state dependent verify voltage ramping time periods for program-verify operation for performance gain. For example, with reference to FIGS. 1A and 1B, the controller 122, the control circuitry 110, the control circuit 150, and/or other circuitry described herein, respectively or collectively, are configured to perform the method 1700. In some examples, a processor or processing device is configured to perform the method 1700. In other examples, two or more processors or processing devices are configured to perform the method 1700, either individually or collectively (e.g., with different processors or processing devices performing different steps of the method 1700).

As shown in FIG. 17, method 1700 starts at step 1702. In step 1702, during a setup clock of a loop of a plurality of loops of a program operation, a first read voltage ramping time period of a plurality of read voltage ramping time periods is used based on a data state being verified during the loop.

In FIG. 17, in step 1704, during a setup clock of another loop of a plurality of loops of a program operation, a second read voltage ramping time period of the plurality of read voltage ramping time periods is used based on a data state being verified during the other loop.

In some embodiments, each verify voltage ramping time period of the plurality of verify voltage ramping time periods may correspond to a set of data states of the plurality of data states. In some embodiments, the first verify voltage ramping time period may be for a different duration than the second verify voltage ramping time period. The first verify voltage ramping time period may correspond to a first set of data states of the plurality of data states and the second verify voltage ramping time period corresponds to a second set of data states of the plurality of data states. In some embodiments, each data state of the first set of data states may be different from each data state in the second set of data states. In some embodiments, each data state of the first set of data states may be of a lower data state than each data state in the second set of data states. In some embodiments, a duration of the first verify voltage ramping time period may be longer than a duration of the second verify voltage ramping time period.

For example, in some embodiments, a control circuit may be configured to use, during a setup clock of a loop of a plurality of loops of a program-verify operation, a first verify voltage ramping time period of a plurality of verify voltage ramping time periods (e.g., t1, t2 of FIG. 16) based on a data state being verified during the loop. In some embodiments, the ramping voltage time period applied may be determined based on the first state being verified in a program loop of a plurality of program loops.

To help further illustrate, assume during a first loop of a plurality of program loops, the control circuit applies a first verify voltage ramping time period that is selected based on the data state being verify in the first loop. For example, if a memory cell is to be verified for a lower data state (say state A), the control circuit may use a longer verify voltage ramping time (e.g., t2 of FIG. 16). In a subsequent loop, if a memory cell is to be verified for a higher data state (say state E), the control circuit may use a shorter verify voltage ramping time (e.g., t1 of FIG. 16).

Structures such as those shown with reference to FIGS. 1A and 1B for programming selection gates included within NAND strings of a non-volatile memory circuit may also be referred to using functional language. In some embodiments, these structures may be described as including "a means for using, during a setup clock of a loop of a plurality of loops of a program-verify operation, a first verify voltage ramping time period of a plurality of verify voltage ramping time periods based on a data state of a plurality of data states being verified during the loop" and "a means for using, during a setup clock of another loop of a plurality of loops of a program-verify operation, a second verify voltage ramping time period of the plurality of verify voltage ramping time periods based on a data state of the plurality of data states being verified during the other loop."

The corresponding structure for "a means for using, during a setup clock of a loop of a plurality of loops of a program-verify operation, a first verify voltage ramping time period of a plurality of verify voltage ramping time periods based on a data state of a plurality of data states being verified during the loop" is the controller 122, the control circuitry 110, the control circuit 150 as well as the equivalents of this circuit. The corresponding structure for "a means for using, during a setup clock of another loop of a plurality of loops of a program-verify operation, a second verify voltage ramping time period of the plurality of verify voltage ramping time periods based on a data state of the plurality of data states being verified during the other loop" is the controller 122, the control circuitry 110, the control circuit 150 as well as the equivalents of this circuit.

The foregoing detailed description of the embodiments has been presented for purposes of illustration and description. It is not intended to be exhaustive or to limit the embodiments to the precise form disclosed. Many modifications and variations are possible in light of the above teachings. The described embodiments were chosen in order to best explain the principles of the embodiments and its practical application, to thereby enable others skilled in the art to best utilize the embodiments in various embodiments and with various modifications as are suited to the particular use contemplated. It is intended that the scope of the embodiments be defined by the claims appended hereto.

What is claimed is:

1. An apparatus, comprising:

a plurality of memory cells connected to word lines and bit lines and configured to retain a threshold voltage corresponding to one of a plurality of data states following a program operation; and a control circuit connected to the word lines and the bit lines and configured to perform a program-verify operation, wherein the program-verify operation includes:

using, during a setup clock of a first loop of a plurality of loops of the program-verify operation, a first verify voltage ramping time period of a plurality of verify voltage ramping time periods corresponding to a first data state being verified during the first loop; and using, during a setup clock of a second loop of the plurality of loops of the program-verify operation, a second verify voltage ramping time period of the plurality of verify voltage ramping time periods corresponding to a second data state being verified during the second loop, wherein the second verify voltage ramping time period is less than the first verify voltage ramping time period.

2. The apparatus as set forth in claim 1, wherein each verify voltage ramping time period of the plurality of verify voltage ramping time periods corresponds to a set of data states of the plurality of data states.

3. The apparatus as set forth in claim 1, wherein the first verify voltage ramping time period corresponds to a first set of data states of the plurality of data states and the second verify voltage ramping time period corresponds to a second set of data states of the plurality of data states.

4. The apparatus as set forth in claim 3, wherein each data state of the first set of data states is different from each data state in the second set of data states.

5. The apparatus as set forth in claim 3, wherein each data state of the first set of data states is of a lower data state than each data state in the second set of data states.

6. A method of operating a non-volatile semiconductor memory device, the method comprising:

performing a program-verify operation, wherein performing the program-verify operation includes using, during a setup clock of a first loop of a plurality of loops of the program-verify operation, a first verify voltage ramping time period of a plurality of verify voltage ramping time periods corresponding to a first data state of a plurality of data states being verified during the first loop, and using, during a setup clock of a second loop of the plurality of loops of the program-verify operation, a second verify voltage ramping time period of the plurality of verify voltage ramping time periods corresponding to a second data state the plurality of data states being verified during the second loop, wherein the second verify voltage ramping time period is less than the first verify voltage ramping time period.

7. The method as set forth in claim 6, wherein each verify voltage ramping time period of the plurality of verify voltage ramping time periods corresponds to a set of data states of the plurality of data states.

8. The method as set forth in claim 6, wherein the first verify voltage ramping time period corresponds to a first set of data states of the plurality of data states and the second verify voltage ramping time period corresponds to a second set of data states of the plurality of data states.

9. The method as set forth in claim 8, wherein each data state of the first set of data states is different from each data state in the second set of data states.

10. The method as set forth in claim 8, wherein each data state of the first set of data states is of a lower data state than each data state in the second set of data states.

* * * * *